United States Patent
Chen et al.

(10) Patent No.: US 12,512,423 B2
(45) Date of Patent: Dec. 30, 2025

(54) ELECTRONIC DEVICE

(71) Applicants: TAIWAN SEMICONDUCTOR MANUFACTURING CO., LTD., Hsinchu (TW); NATIONAL TAIWAN UNIVERSITY, Taipei (TW)

(72) Inventors: Shih-Yuan Chen, Taipei (TW); Jiun-Yun Li, Taipei (TW); Rui-Fu Xu, Tainan (TW); Chiung-Yu Chen, Taipei (TW); Ting-I Yeh, Taichung (TW); Yu-Jui Wu, Taipei (TW); Yao-Chun Chang, Taipei (TW)

(73) Assignees: TAIWAN SEMICONDUCTOR MANUFACTURING CO., LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 74 days.

(21) Appl. No.: 17/690,955

(22) Filed: Mar. 9, 2022

(65) Prior Publication Data

US 2022/0199555 A1 Jun. 23, 2022

Related U.S. Application Data

(62) Division of application No. 16/656,233, filed on Oct. 17, 2019, now Pat. No. 11,276,653.

(51) Int. Cl.
*H01L 23/64* (2006.01)
*H10D 30/01* (2025.01)
*H10D 84/40* (2025.01)

(52) U.S. Cl.
CPC .......... *H01L 23/642* (2013.01); *H01L 23/645* (2013.01); *H10D 30/023* (2025.01); *H10D 84/403* (2025.01)

(58) Field of Classification Search
CPC . H01L 23/642; H01L 23/645; H01L 27/0635; H01L 29/66484
USPC .......................................................... 257/296
See application file for complete search history.

(56) References Cited

U.S. PATENT DOCUMENTS

| | | | |
|---|---|---|---|
| 5,250,910 A * | 10/1993 | Yabuki | H03B 5/1847 331/114 |
| 5,309,117 A * | 5/1994 | Cadotte, Jr. | H03B 5/1847 331/107 S |
| 7,547,932 B2 | 6/2009 | Zhang | |
| 8,507,894 B2 | 8/2013 | Morello et al. | |
| 2002/0190249 A1* | 12/2002 | Williams | H01L 29/66977 257/14 |
| 2003/0231093 A1 | 12/2003 | Hsu et al. | |

(Continued)

FOREIGN PATENT DOCUMENTS

WO 2018004634 A1 1/2018

OTHER PUBLICATIONS

J P Dehollain et al., "Nanoscale broadband transmission lines for spin qubit control", Nanotechnology 24, 015202 (10pp) Dec. 7, 2012.

*Primary Examiner* — Dzung Tran
(74) *Attorney, Agent, or Firm* — Maschoff Brennan

(57) ABSTRACT

An electronic device includes a substrate, a transistor, and a ring resonator. The transistor is over the substrate. The ring resonator is over the substrate and includes a conductive loop and an impedance matching element. The conductive loop overlaps with the transistor. The impedance matching element is on the conductive loop and electrically isolated from the transistor.

20 Claims, 27 Drawing Sheets

(56) References Cited

U.S. PATENT DOCUMENTS

| | | | |
|---|---|---|---|
| 2005/0258507 A1 | 11/2005 | Tseng et al. | |
| 2009/0212374 A1 | 8/2009 | Huang et al. | |
| 2010/0019300 A1* | 1/2010 | Yu | H01L 27/0617 |
| | | | 257/E29.345 |
| 2010/0270534 A1* | 10/2010 | Pioro-Ladriere | B82Y 10/00 |
| | | | 257/14 |
| 2012/0043598 A1* | 2/2012 | de Rochemont | H01L 25/16 |
| | | | 257/300 |
| 2012/0074386 A1 | 3/2012 | Rachmady | |
| 2012/0091558 A1* | 4/2012 | Loke | H01L 27/0617 |
| | | | 257/E29.325 |
| 2016/0225759 A1 | 8/2016 | de Rochemont | |
| 2018/0069288 A1 | 3/2018 | Minev | |
| 2019/0042962 A1 | 2/2019 | Abraham | |

* cited by examiner

ELECTRONIC DEVICE

PRIORITY CLAIM AND CROSS-REFERENCE

The present application is a divisional application of the U.S. patent application Ser. No. 16/656,233, filed Oct. 17, 2019, now U.S. Pat. No. 11,276,653, issued Mar. 15, 2022, which is incorporated herein by reference in its entirety.

BACKGROUND

On the roadmap towards building a scalable, silicon-based quantum computer, several milestones have already been achieved. Some embodiments: The development of a single-ion implantation technology that allows the precise placement of individual phosphorus atoms in silicon; The application of advanced nanofabrication, microwave and low-temperature techniques to the production and characterization of Single Electron Transistors (rf-SETs), with a charge sensitivity close to the quantum limit; The control and detection of single electron transfers between individual phosphorus donors, obtained by combining the single-ion implantation and SET techniques; and, The layout of quantum device structures for universal fault-tolerant quantum computation and the subsequent analysis of the error threshold.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
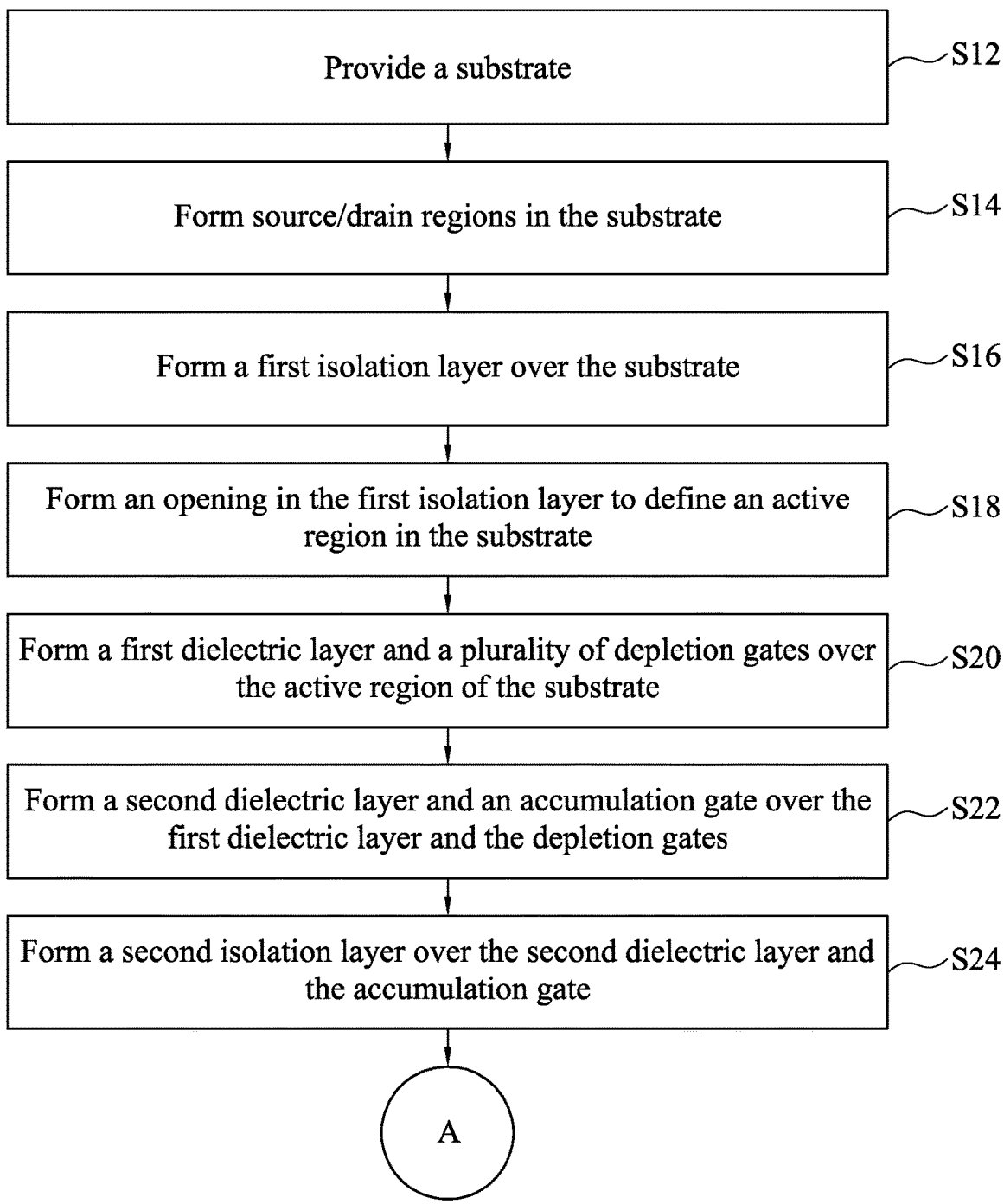
FIGS. 1A and 1B are a flowchart of a method for making an electronic device according to some aspects of the present disclosure in various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated.

The embodiments of the present disclosure provide an electronic device having a ring resonator to implement a qubit with high efficiency. The qubit is configured for the control and readout of an electron or hole spin of a single dopant in a (semiconductor) substrate. In some embodiments, a transistor used in the qubit may be realized on the device selected from the group including planar devices, multi-gate devices, FinFETs, nanosheet-gate FETs, and gate-all-around FETs.

Figure 1B:
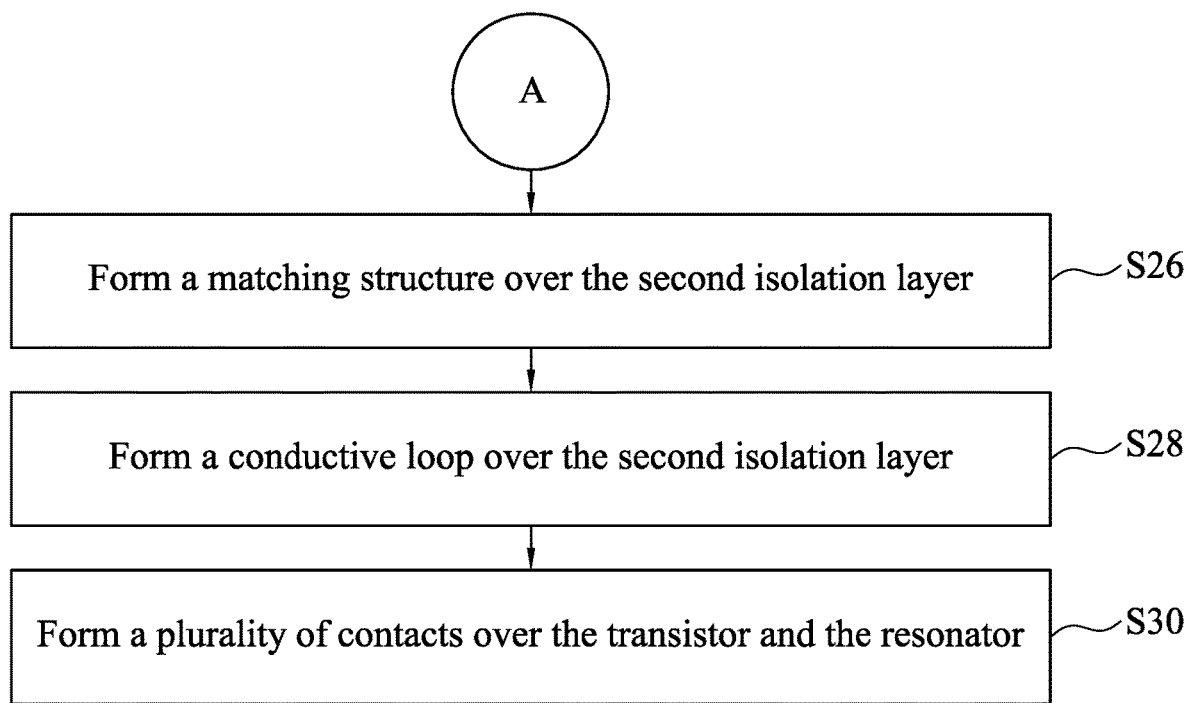
Figure 2A:
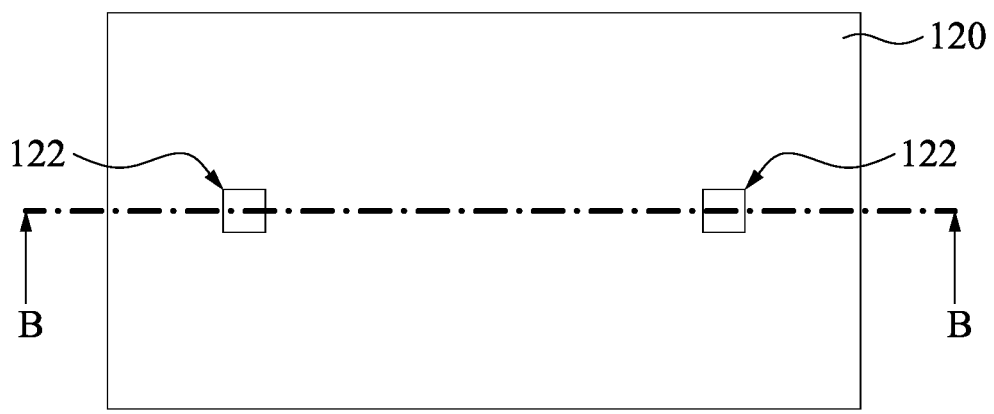
FIGS. 2A to 13B illustrate a method in various stages of fabricating an electronic device in accordance with some embodiments of the present disclosure.
Figure 2B:
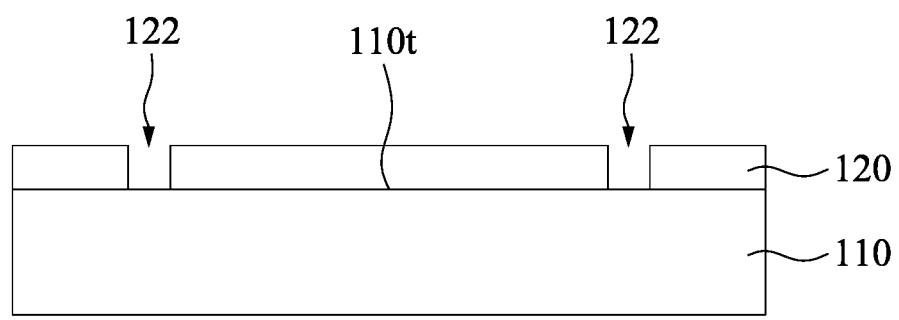

FIGS. 1A and 1B are a flowchart of a method M10 for making an electronic device according to some aspects of the present disclosure in various embodiments. Various operations of the method M10 are discussed in association with cross-section diagrams FIGS. 2A-13B. Throughout the various views and illustrative embodiments, like reference numbers are used to designate like elements. In operation S12 of method M10, a substrate 110 is provided, as shown in FIGS. 2A and 2B, where FIG. 2B is a cross-sectional view taken along B-B of FIG. 2A. In some embodiments, the substrate 110 may include silicon (Si). Alternatively, the substrate 110 may include germanium (Ge), silicon germanium (GaAs), or other appropriate semiconductor materials. In some alternative embodiments, the substrate 110 may include an epitaxial layer. Furthermore, the substrate 110 may include a semiconductor-on-insulator (SOI) structure having a buried dielectric layer therein. The buried dielectric layer may be, for example, a buried oxide (BOX) layer. The SOI structure may be formed by a method referred to as separation by implantation of oxygen (SIMOX) technology, wafer bonding, selective epitaxial growth (SEG), or other appropriate method.

Figure 3A:
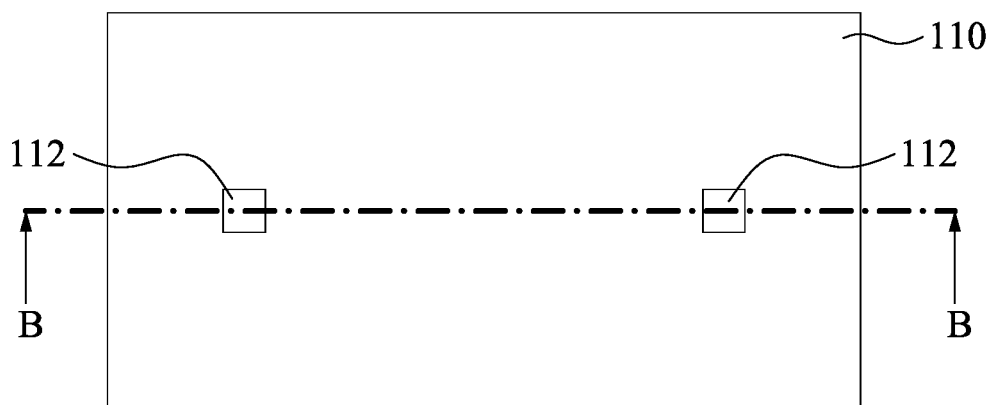
Figure 3B:
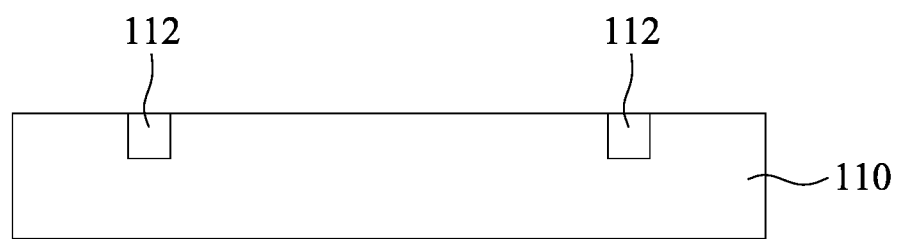

In operation S14 of method M10, source/drain regions 112 are formed in the substrate 110, as shown in FIGS. 2A, 2B, 3A, and 3B, where FIG. 3B is a cross-sectional view taken along B-B of FIG. 3A. A patterned mask layer 120 (may be a hard mask layer) is formed over the top surface 110t of the substrate 110. In some embodiments, the patterned mask layer 120 includes nitride. For example, the mask layer 120 is made of silicon nitride (SiN). However, other materials, such as SiON, silicon carbide, or combinations thereof, may also be used. The mask layer 120 may be formed by a process such as chemical vapor deposition (CVD), plasma enhanced chemical vapor deposition (PECVD), or low pressure chemical vapor deposition (LPCVD). Alternatively, the mask layer 120 may be made of a silicon oxide and then converted to SiN by nitridation.

Then, a plurality of openings 122 are formed in the mask layer 120. The patterning of the opening 122 may be done using a combination of photolithography and etching process. For example, a photoresist may be formed over the mask layer 120. The photoresist is then patterned to expose the mask layer 120. The photoresist can be formed by using a spin-on technique and can be patterned using acceptable photolithography techniques. The etching may be acceptable etch process, such as a reactive ion etch (RIE), neutral beam etch (NBE), the like, or a combination thereof.

Reference is made to FIGS. 3A and 3B. An implantation process is then performed to introduce impurities into the substrate 110 to form source/drain regions 112, and the mask layer 120 (see FIGS. 2A and 2B) may act as a mask to substantially prevent the impurities from being implanted into other regions of the substrate 110. The impurities may be n-type impurities or p-type impurities. The n-type impurities may be phosphorus, arsenic, or the like, and the p-type impurities may be boron, $BF_2$, or the like.

Then, the photoresist and the mask layer 120 are removed. In some embodiments, the photoresist may be removed using a process such as ashing, etching, or the like. Subsequently, the mask layer 120 may be removed using a process such as wet etching, or the like. After the removal process, the substrate 110 with the source/drain regions 112 is exposed. One or more annealing processes may be performed to activate the source/drain regions 112. The annealing processes include rapid thermal annealing (RTA) and/or laser annealing processes. The annealing processes may repair implant damage from the impurities on the bottom and sidewalls of the source/drain regions 112.

Figure 4A:
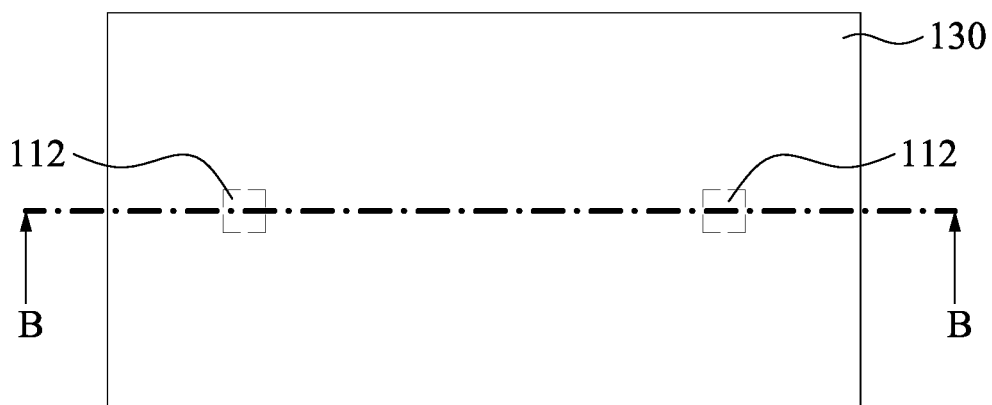
Figure 4B:
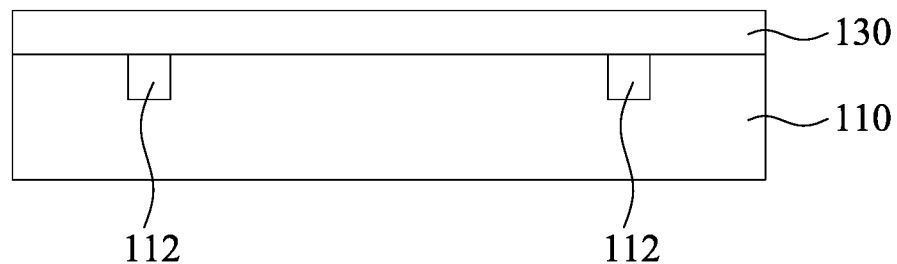

In operation S16 of method M10, a first isolation layer 130 is formed over the substrate 110, as shown in FIGS. 4A and 4B, where FIG. 4B is a cross-sectional view taken along B-B of FIG. 4A. Specifically, the first isolation layer 130 may include materials such as tetraethylorthosilicate (TEOS)-formed oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The first isolation layer 130 may be deposited by a PECVD process or other suitable deposition technique.

Figure 5A:
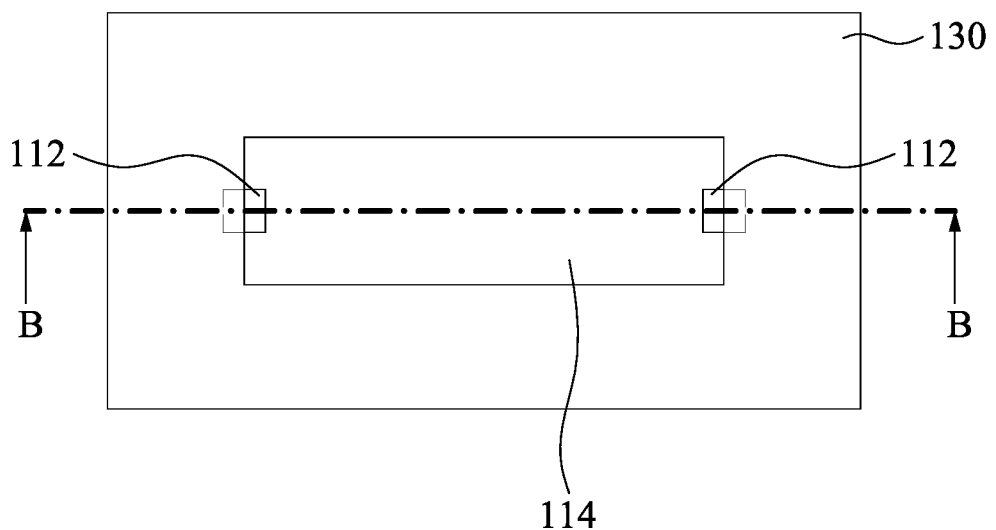
Figure 5B:
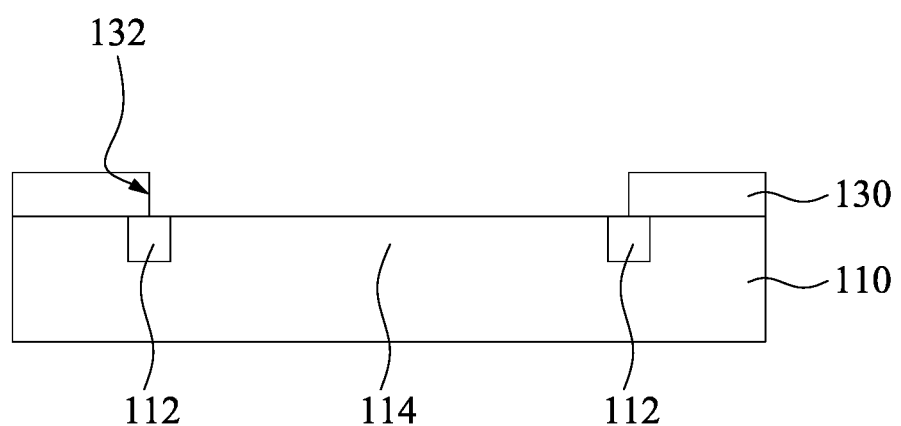

In operation S18 of method M10, an opening 132 is formed in the first isolation layer 130 to define an active region 114 in the substrate 110, as shown in FIGS. 5A and 5B, where FIG. 5B is a cross-sectional view taken along B-B of FIG. 5A. In some embodiments, the opening 132 may be formed using a combination of photolithography and etching process as mentioned above. The opening 132 exposes a portion of the substrate 110 between the source/drain regions 112 and portions of the source/drain regions 112. The exposed portion of the substrate 110 is defined as the active region 114. The top view of the active region 114 may be circular, elliptical, rectangular, square, or some other shapes with or without rounded corners.

Figure 6A:
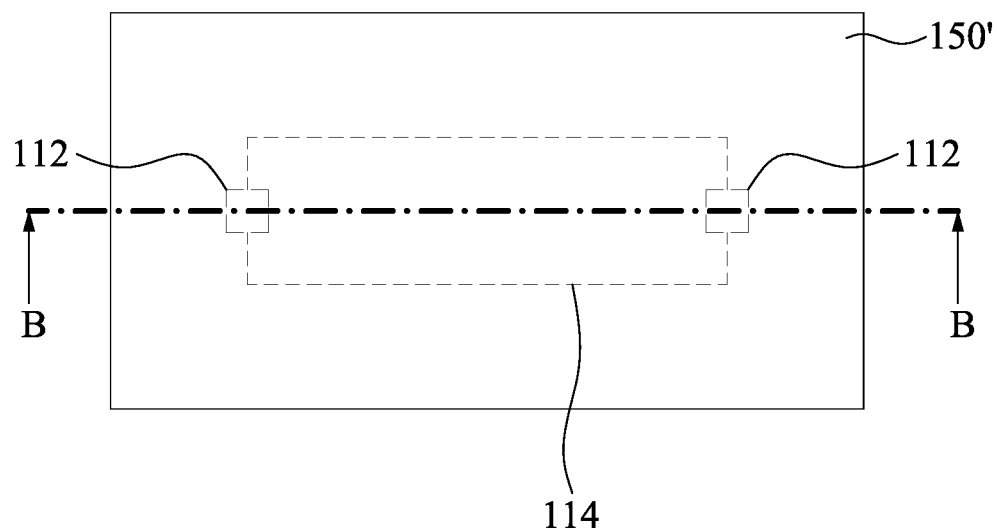
Figure 6B:
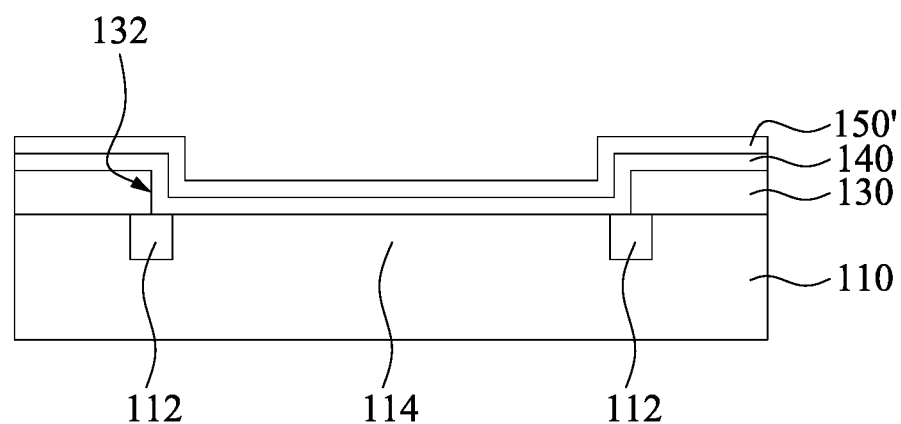

In operation S20 of method M10, a first dielectric layer 140 and a plurality of depletion gates (or barrier gates) 150 are formed over the active region 114 of the substrate, as shown in FIGS. 6A, 6B, 7A, and 7B. Reference is made to 6A and 6B, where FIG. 6B is a cross-sectional view taken along B-B of FIG. 6A. The first dielectric layer 140 is conformally formed in the opening 132. The first dielectric layer 140 is over the active region 114 and the source/drain regions 112. In some embodiments, the first dielectric layer 140 may include silicon dioxide, silicon nitride, or other suitable material. Alternatively, the first dielectric layer 140 can be a high-κ dielectric layer having a dielectric constant (κ) higher than the dielectric constant of $SiO_2$, i.e. κ>3.9. The dielectric layer 140 may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, (Ba,Sr)$TiO_3$ (BST), $Al_2O_3$, $Si_3N_4$, oxynitrides (SiON), or other suitable materials. The first dielectric layer 140 is deposited by suitable techniques, such as ALD, CVD, PVD, thermal oxidation, combinations thereof, or other suitable techniques.

Then, a conductive material 150' is formed over the first dielectric layer 140. The conductive material 150' includes one or more layers of conductive material. Examples of the conductive material 150' include W, Ti, TiAlC, Al, TiAl, TaN, TaAlC, TiN, TiC, Co, TaC, Al, TiAl, HfTi, TiSi, TaSi, TiAlC, combinations thereof, or the like. The conductive material 150' may be formed by chemical vapor deposition (CVD), physical vapor deposition (PVD) including sputtering, atomic layer deposition (ALD) or other suitable method.

Figure 7A:
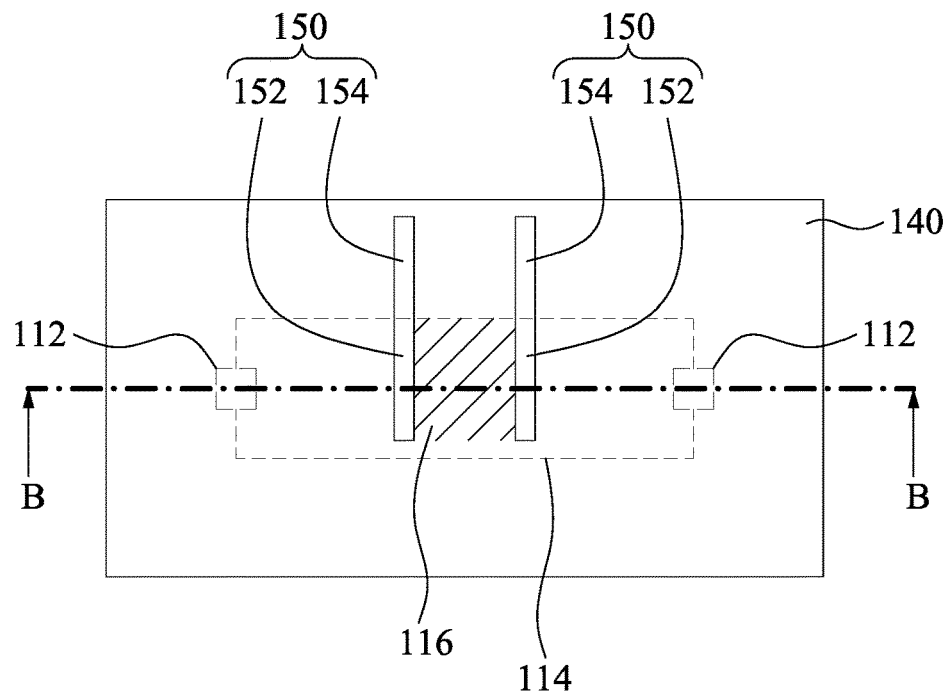
Figure 7B:
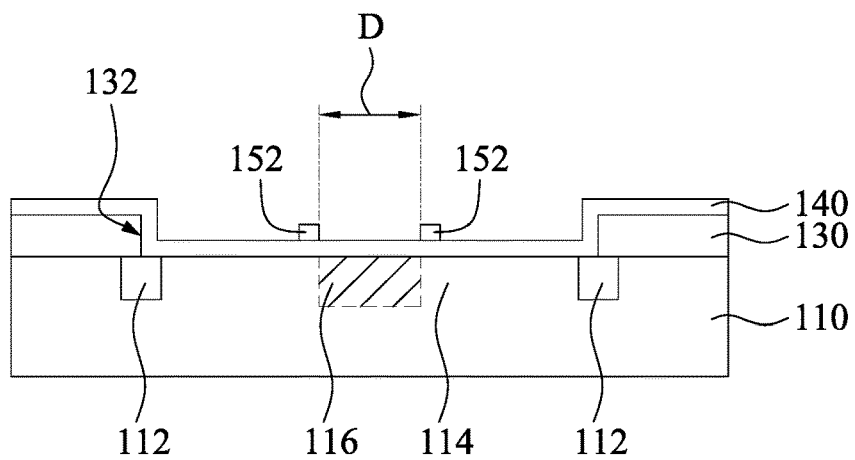

Reference is made to FIGS. 7A and 7B, where FIG. 7B is a cross-sectional view taken along B-B of FIG. 7A. Then, the conductive material 150' is patterned to form the depletion gates 150. The patterning of the conductive material 150' may be formed using a combination of photolithography and etching process as mentioned above. A portion 152 of each of the depletion gates 150 is over the active region 114 and between the source/drain regions 112 of the substrate 110. Another portion 154 of each of the depletion gates 150 extends over the first isolation layer 130 to be anding pads for the following formed contact 104 (see FIG. 13A). The depletion gates 150 are spaced apart from each other. The portions 152 of the depletion gates 150 define a tunnel barrier 116 in the active region 114. A distance D between the portions 152 of the depletion gates 150 may be in a range of about 20 nm and about 100 nm. If the distance D is less than about 20 nm, quantum dot may not be formed in the active region 114 and between the depletion gates 150. If the distance D is greater than about 100 nm, more than one charge (quantum dot) may be formed in the active region 114 and between the depletion gates 150.

Figure 8A:
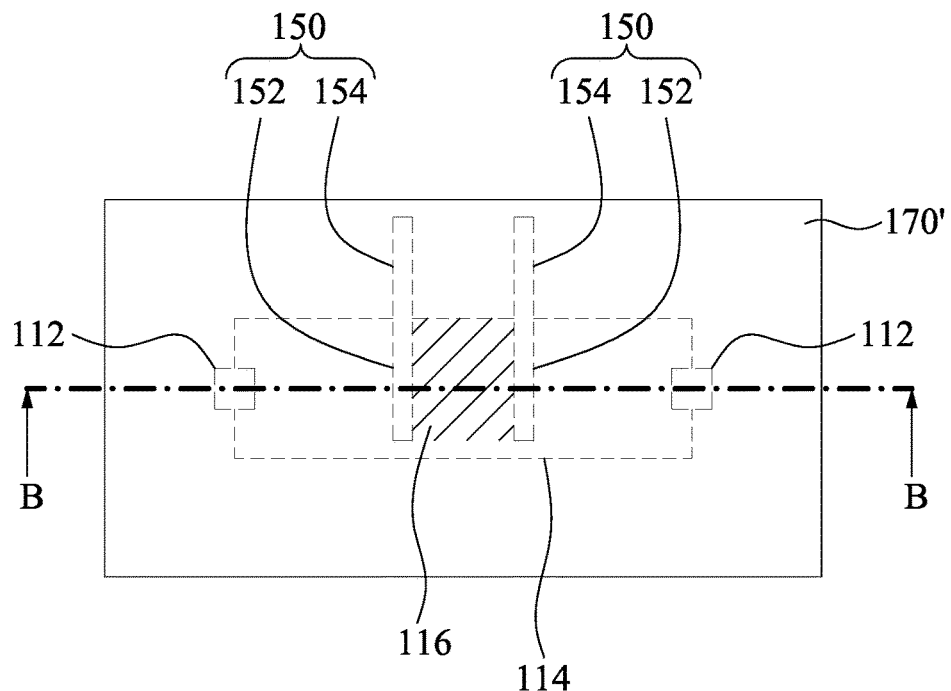
Figure 8B:
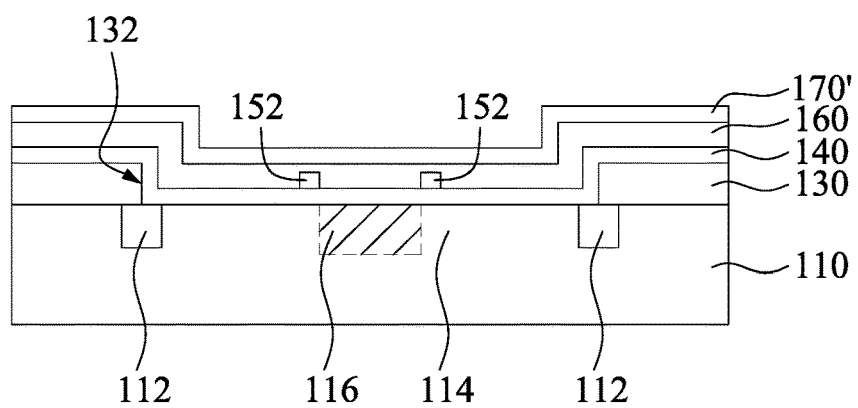

In operation S22 of method M10, a second dielectric layer 160 and an accumulation gate 170 are formed over the first dielectric layer 140 and the depletion gates 150, as shown in FIGS. 8A, 8B, 9A, and 9B. Reference is made to 8A and 8B, where FIG. 8B is a cross-sectional view taken along B-B of FIG. 8A. The second dielectric layer 160 is conformally formed over the first dielectric layer 140 and the depletion gates 150, such that the second dielectric layer 160 covers the first dielectric layer 140 and the depletion gates 150. In some embodiments, the second dielectric layer 160 may include silicon dioxide, silicon nitride, or other suitable material. Alternatively, the second dielectric layer 160 can be a high-κ dielectric layer having a dielectric constant (κ) higher than the dielectric constant of $SiO_2$, i.e. κ>3.9. The second dielectric layer 160 may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, (Ba,Sr)$TiO_3$ (BST), $Al_2O_3$, $Si_3N_4$, oxynitrides (SiON), or other suitable materials. The second dielectric layer 160 is deposited by suitable techniques, such as ALD, CVD, PVD, thermal oxidation, combinations thereof, or other suitable techniques.

Then, another conductive material 170' is formed over the second dielectric layer 160. The conductive material 170' includes one or more layers of conductive material. Examples of the conductive material 170' include W, Ti, TiAlC, Al, TiAl, TaN, TaAlC, TiN, TiC, Co, TaC, Al, TiAl, HfTi, TiSi, TaSi, TiAlC, combinations thereof, or the like. The conductive material 170' may be formed by chemical vapor deposition (CVD), physical vapor deposition (PVD) including sputtering, atomic layer deposition (ALD) or other suitable method. The conductive material 150' and 170' (i.e., the depletion gates 150 and the following formed accumulation gate 170) are made of the same or different materials.

Figure 9A:
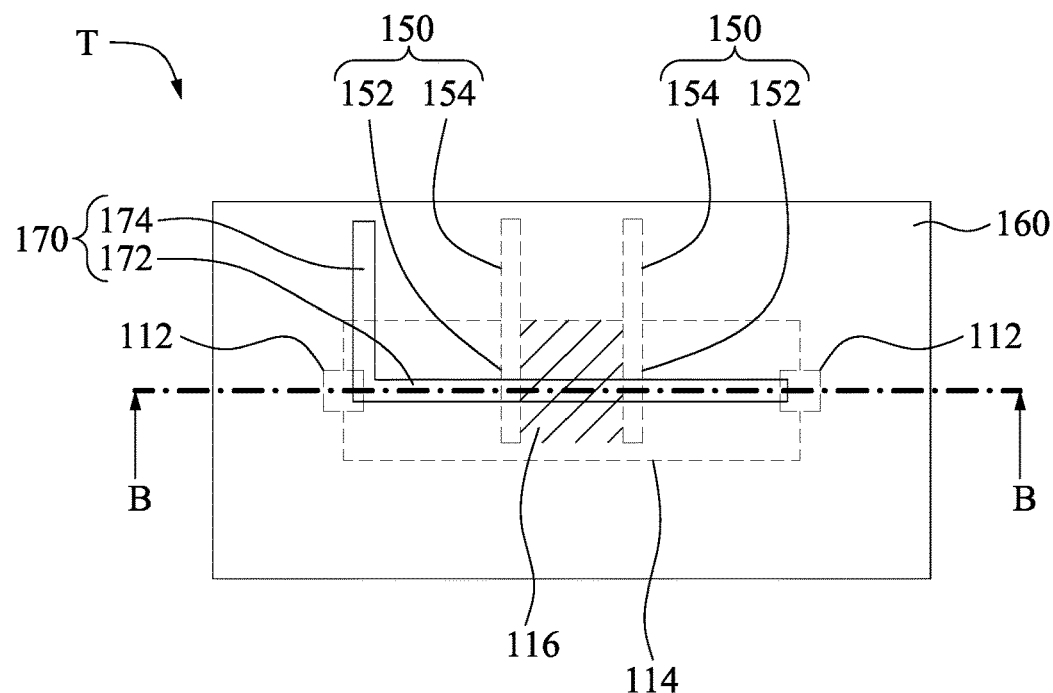
Figure 9B:
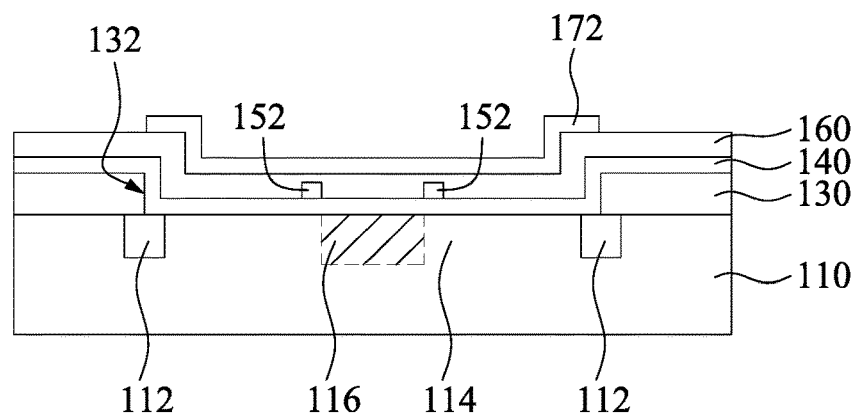

Reference is made to FIGS. 9A and 9B, where FIG. 9B is a cross-sectional view taken along B-B of FIG. 9A. Then, the conductive material 170' is patterned to form the accumulation gate 170. The patterning of the conductive material 170' may be formed using a combination of photolithography and etching process as mentioned above. A portion 172 of the accumulation gate 170 is over the active region 114 and the source/drain regions 112 and crosses over the depletion gates 150. This portion 172 of the accumulation gate 170 and the depletion gates 150 extend in different directions. For example, the portion 172 of the accumulation gate 170 may be substantially perpendicular to the portion 152 of the depletion gates 150. Another portion 174 of the accumulation gate 170 extends over the first isolation layer 130 to be a landing pad for the following formed contact 106 (see FIG. 13A). The source/drain regions 112, the active region 114, the depletion gates 150, and the accumulation gate 170 form a transistor T.

Figure 10A:
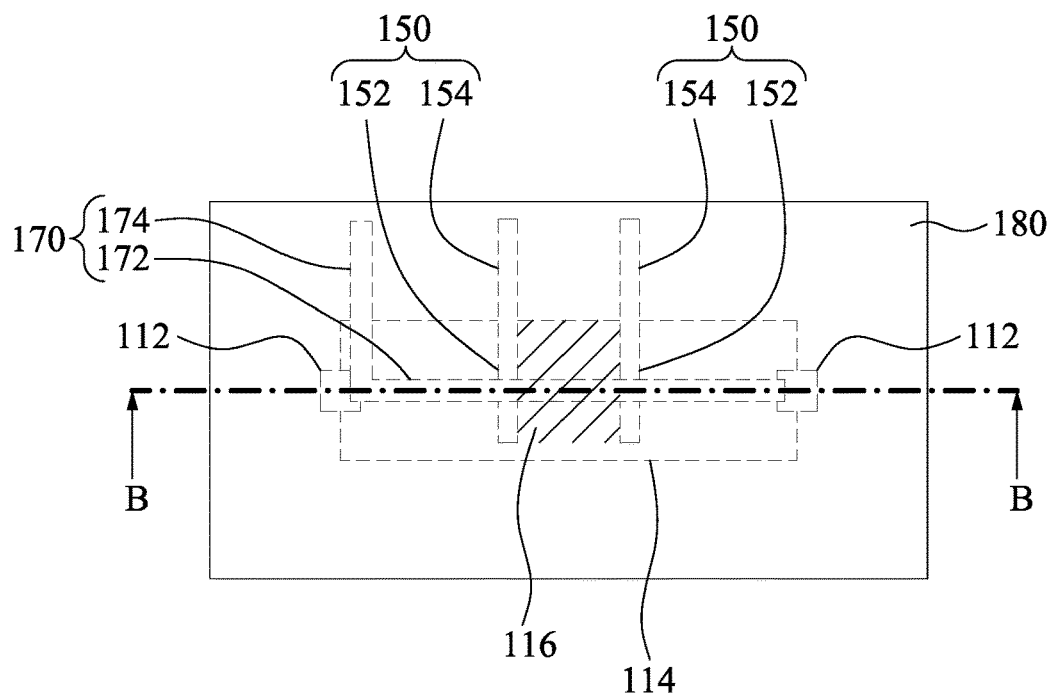
Figure 10B:
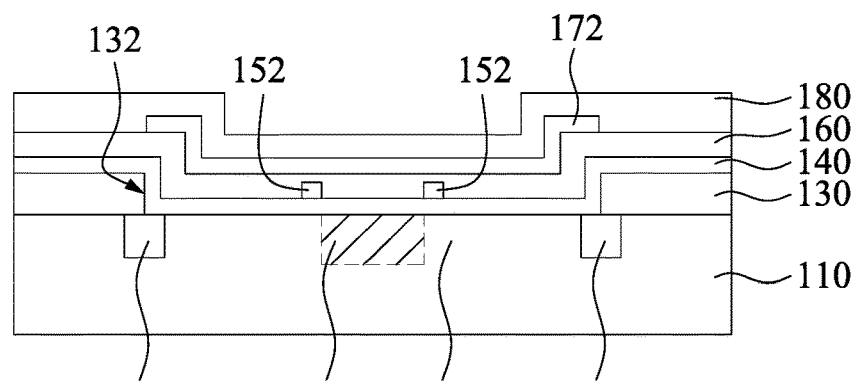

In operation S24 of method M10, a second isolation layer 180 is formed over the second dielectric layer 160 and the accumulation gate 170, as shown in FIGS. 10A and 10B, where FIG. 10B is a cross-sectional view taken along B-B of FIG. 10A. Specifically, the second isolation layer 180 covers the accumulation gate 170 and may include materials such as tetraethylorthosilicate (TEOS)-formed oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The second isolation layer 180 may be deposited by a PECVD process or other suitable deposition technique.

Figure 11A:
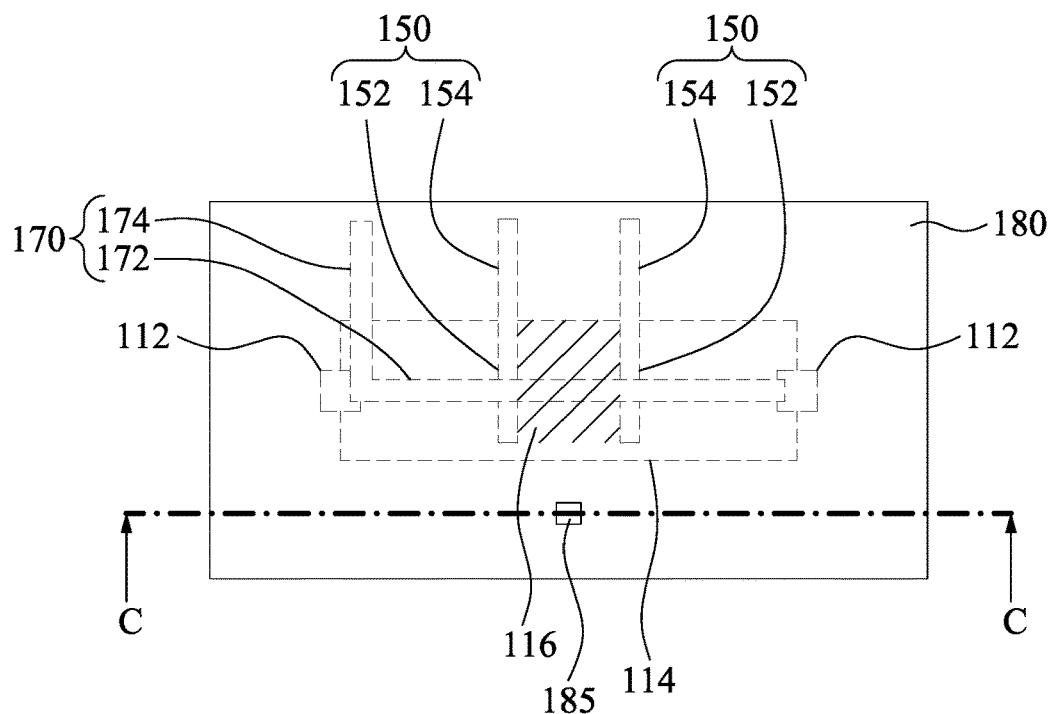
Figure 11B:
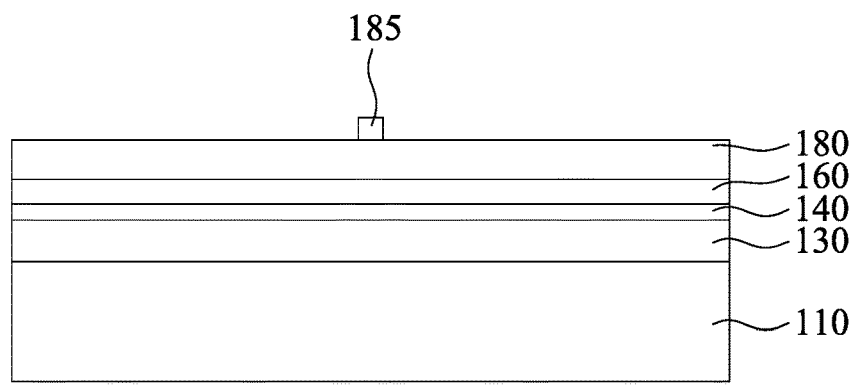

In operation S26 of method M10, a matching structure 185 is formed over the second isolation layer 180, as shown in FIGS. 11A and 11B, where FIG. 11B is a cross-sectional view taken along C-C of FIG. 11A. In some embodiments, the matching structure 185 may be formed outside the active region 114 from the top view. That is, the matching structure 185 is disposed over the first isolation layer 130. In some embodiments, a dielectric layer is formed over the second isolation layer 180, and the dielectric layer is patterned to form the matching structure 185 using a combination of photolithography and etching process. The material of the matching structure 185 may depend on the capacitance of the following formed capacitor C3 (see FIG. 12D). In some embodiments, the matching structure 185 may include materials such as tetraethylorthosilicate (TEOS)-formed oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The matching material 185 may be deposited by an ALD process or other suitable deposition technique.

Figure 12A:
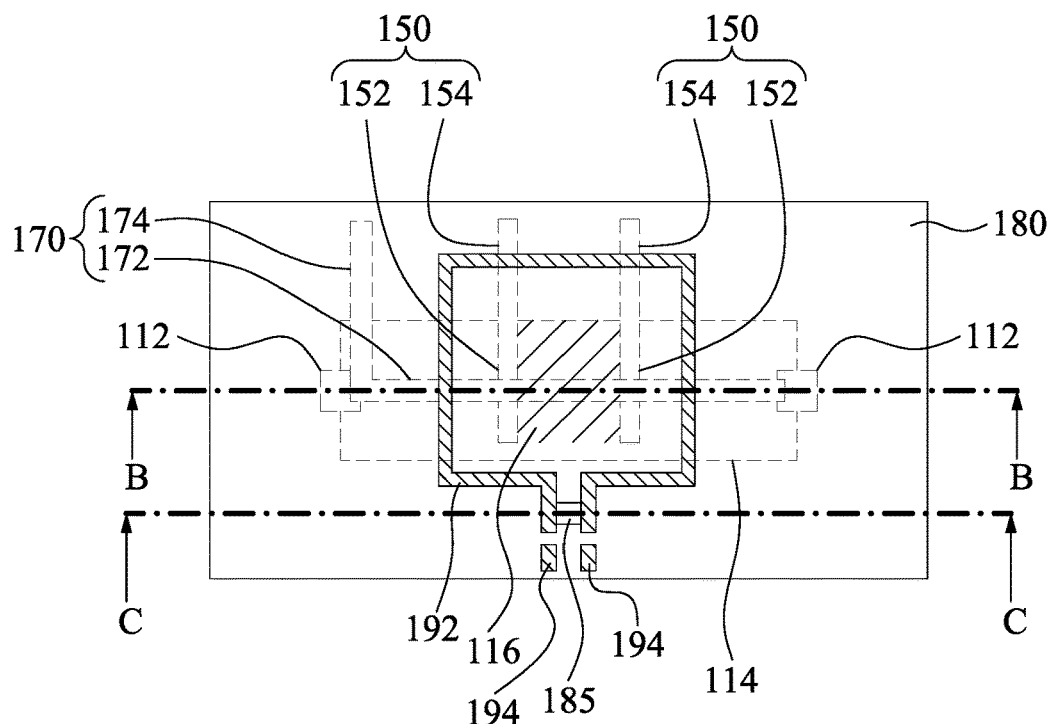
Figure 12B:
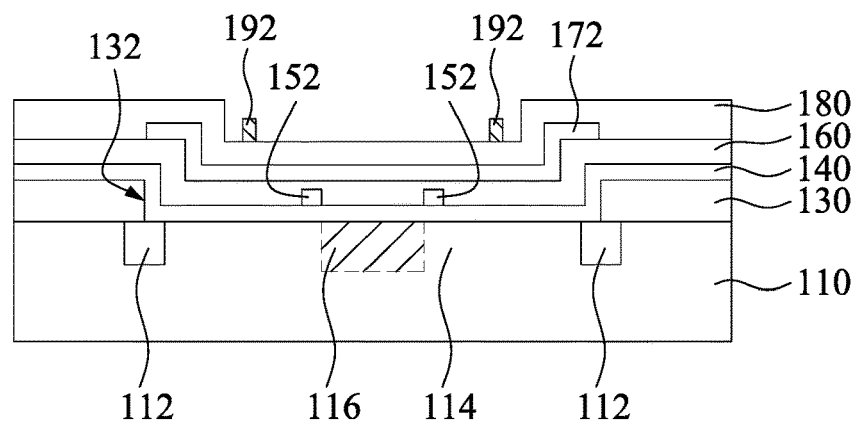
Figure 12C:
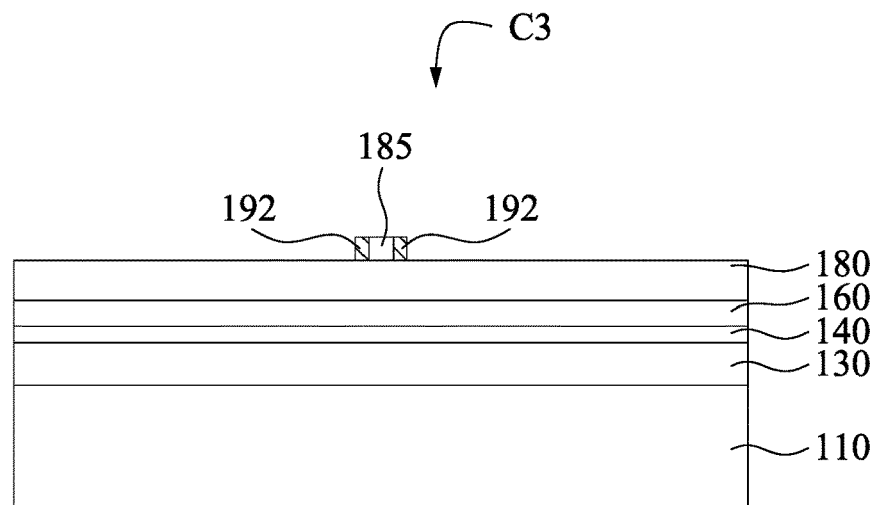
Figure 12D:
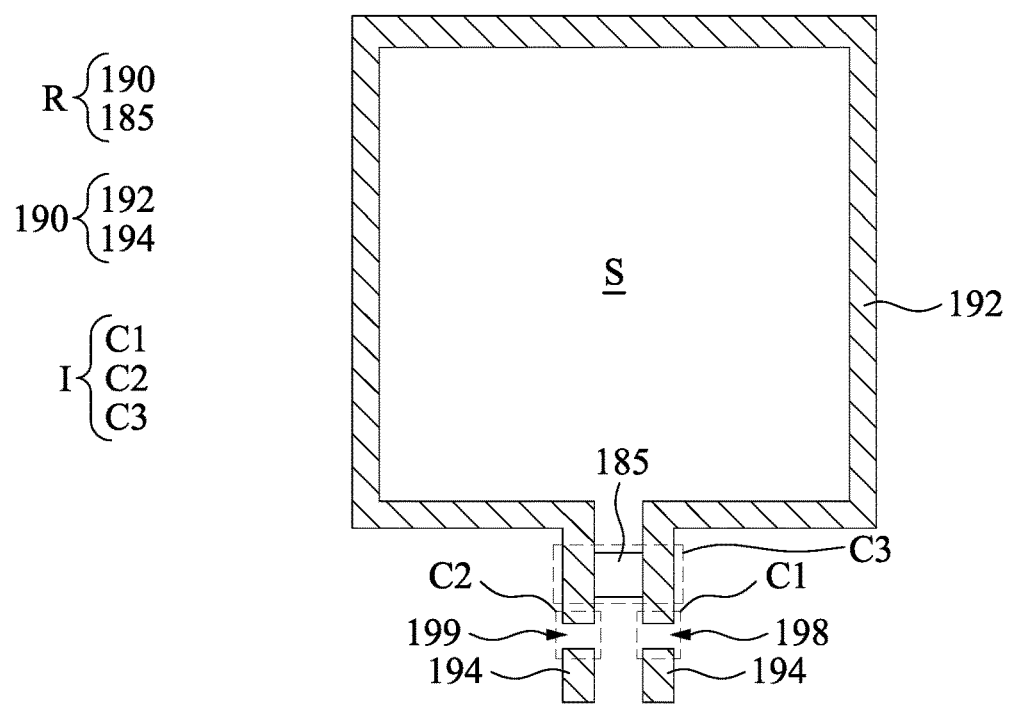

In operation S28 of method M10, a conductive loop 190 is formed over the second isolation layer 180, as shown in FIGS. 12A to 12D, where FIG. 12B is a cross-sectional view taken along B-B of FIG. 12A, FIG. 12C is a cross-sectional view taken along C-C of FIG. 12A, and FIG. 12B is an enlarged view of the conductive loop 190 and the matching structure 185 in FIG. 12A. For example, another conductive material is formed over the second isolation layer 180, and the conductive material is patterned to form the conductive loop 190 using a combination of photolithography and etching process. In some embodiments, the conductive loop 190 includes one or more layers of conductive material. Examples of the conductive loop 190 include W, Ti, TiAlC, Al, TiAl, TaN, TaAlC, TiN, TiC, Co, TaC, Al, TiAl, HfTi, TiSi, TaSi, TiAlC, combinations thereof, or the like. The conductive loop 190 may be formed by chemical vapor deposition (CVD), physical vapor deposition (PVD) including sputtering, atomic layer deposition (ALD) or other suitable method.

In FIG. 12A, the conductive loop 190 overlaps with the tunnel barrier 116. Therefore, the magnetic field formed in the conductive loop 190 resonates with the dopant in the tunnel barrier 116, and a qubit is formed in the tunnel barrier 116. The conductive loop 190 includes a loop portion 192 and two feeding lines 194. The loop portion 192 forms an accommodating space S. The accommodating space S overlaps with the tunnel barrier 116. A gap 198 is formed between an end of the loop portion 192 and one of the feeding lines 194, and another gap 199 is formed between another end of the loop portion 192 and another of the feeding lines 194. Therefore, the loop portion 192 and the feeding lines 194 form two (series) capacitors C1 and C2 with the gaps 198 and 199. In some embodiments, the capacitance of the capacitors C1 and C2 are substantially the same, such that the current flows in the feeding lines 194 may be substantially the same but in opposite directions. In some embodiments, the gaps 198 and 199 have substantially the same distance, and the distance of the gaps 198 and 199 depends on the desired capacitance of the capacitors C1 and C2. Furthermore, in some other embodiments, the gaps 198 and 199 may be filled with dielectric materials to tune the capacitance of the capacitors C1 and C2.

Moreover, the loop portion 192 is in contact with the matching material 185, such that the loop portion 192 and the matching material 185 form a (parallel) capacitor C3 as shown in FIG. 12C. The capacitance of the capacitor C3 depends on the dielectric constant of the matching material 185 and the distance between the feeding lines 194. In FIG. 12A, the conductive loop 190 and the matching structure 185 form a ring resonator R. The capacitors C1, C2, and C3 form an impedance matching element I of the ring resonator R. The impedance matching element I is configured to determine the resonance frequency of the ring resonator R. In some embodiments, the impedance matching element I includes the capacitors C1, C2, and C3. In some other embodiments, however, the impedance matching element I includes the capacitors C1 and C2 or only includes the capacitance C3.

Figure 13A:
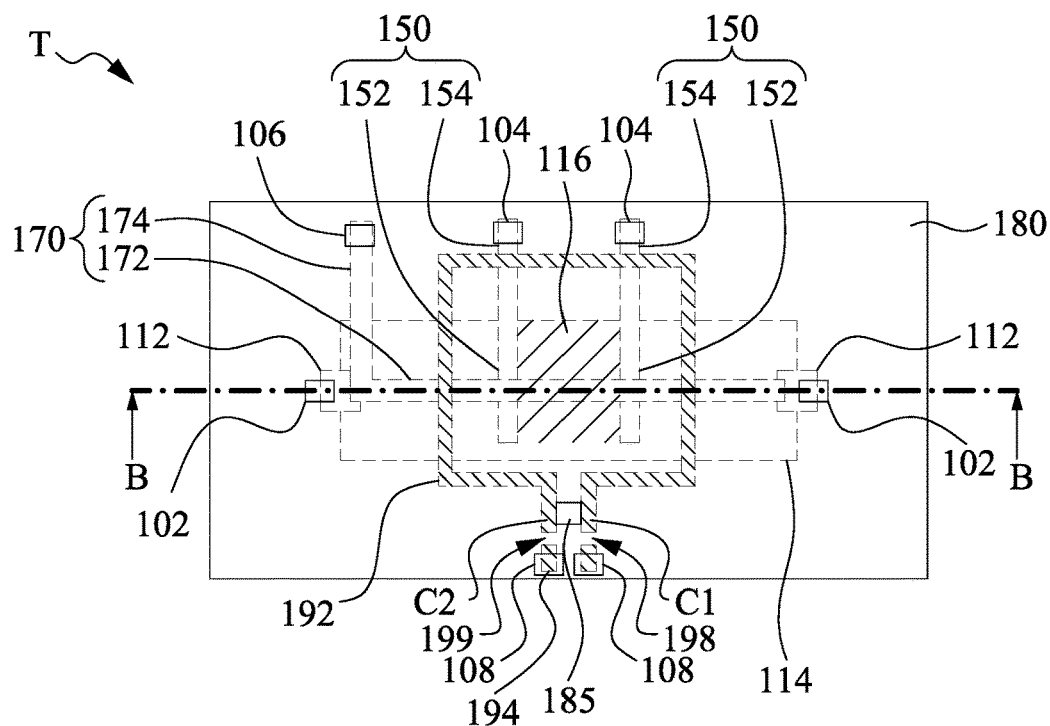
Figure 13B:
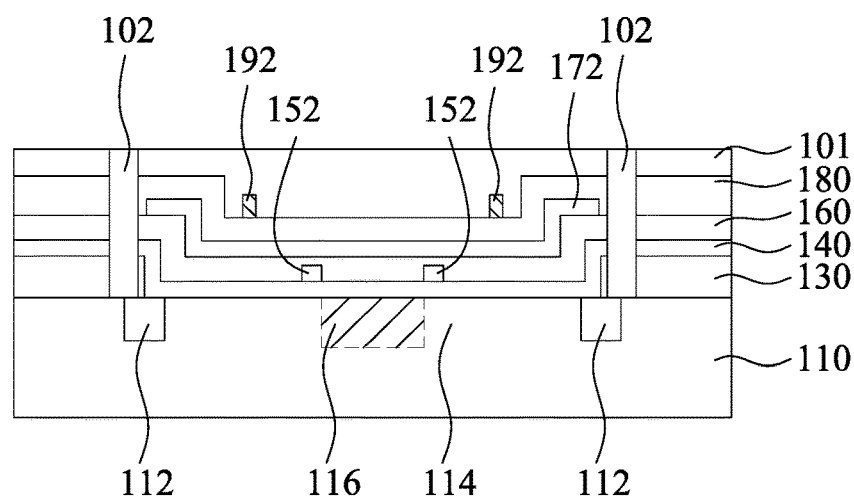

In operation S30 of method M10, a plurality of contacts 102, 104, 106, and 108 are formed over the transistor T and the ring resonator R, as shown in FIGS. 13A and 13B, where FIG. 13B is a cross-sectional view taken along B-B of FIG. 13A. In some embodiments, a protection layer 101 is formed over the transistor T and the ring resonator R. In some embodiments, the protection layer 101 may include silicon dioxide, silicon nitride, or other suitable material. Alternatively, the protection layer 101 can be a high-κ dielectric layer having a dielectric constant (κ) higher than the dielectric constant of $SiO_2$, i.e. κ>3.9. The protection layer 101 may include LaO, AlO, ZrO, TiO, $Ta_2O_5$, $Y_2O_3$, $SrTiO_3$ (STO), BaTiO$_3$ (BTO), BaZrO, HfZrO, HfLaO, HfSiO, LaSiO, AlSiO, HfTaO, HfTiO, (Ba,Sr)TiO$_3$ (BST), Al$_2$O$_3$, Si$_3$N$_4$, oxynitrides (SiON), or other suitable materials. The protection layer 101 is deposited by suitable techniques, such as ALD, CVD, PVD, thermal oxidation, combinations thereof, or other suitable techniques. In some embodiments, materials of the protection layer 101 are filled into the gaps 198 and 199 of the conductive loop 190. In some other embodiments, however, the protection layer 101 is over the gaps 198 and 199 and air fills in the gaps 198 and 199. The filling materials (materials of the protection layer 101 or air) in the gaps 198 and 199 determine the capacitance of the capacitors C1 and C2.

Then, the protection layer 101 is etched to form a plurality of openings by various methods, including a dry etch, a wet etch, or a combination of dry etch and wet etch. The openings extend through the protection layer 101 (and the underlying dielectric layers) and respectively expose the source/drain regions 112, the depletion gates 150, the accumulation gate 170, and the conductive loop 190. Filling materials are then formed in the openings. The filling materials are connected to the source/drain regions 112, the depletion gates 150, the accumulation gate 170, or the conductive loop 190. In some embodiments, the filling materials may be filled in the openings, and excessive portions of the filling materials are removed by performing a CMP process to form the contacts 102, 104, 106, and 108. The contacts 102 are respectively connected to the source/drain regions 112, the contacts 104 are respectively connected to the portions 154 of the depletion gates 150, the contact 106 is connected to the portion 174 of the accumulation gate 170, and the contacts 108 are respectively connected to the feeding lines 194 of the conductive loop 190. The contacts 102, 104, 106, and 108 may be made of tungsten, aluminum, copper, or other suitable materials.

In FIG. 12A, when the electronic device is operating, the accumulation gate 170 creates a gate-induced charge layer in the active region 114. Then, the depletion gates 150 form a tunnel barrier 116 that interrupts the gate-induced charge layer with a single dopant implanted in the active region 114. The depletion gates 150 also have the function of bringing the dopant level in resonance with the Fermi level $E_F$ of the leads. In the presence of a magnetic field, the Zeeman-split dopant states can also be resolved. By applying a source-drain bias and tuning the dopant level at resonance with the Fermi energies of the gate-induced charge layer, a sharp conductivity peak is expected to be observed. By inducing a Zeeman splitting of the electron or hole spin states with an external magnetic field, a spin-dependent tunneling may be observed. Because of charging effects, the resonant charge tunneling is sequential, that is, only one charge at a time can traverse the barrier by passing through the dopant level. The coherent manipulation of the quantum state of a spin qubit may use the application of magnetic fields, with a frequency matching the Zeeman splitting of the spin states. The frequency is determined by the impedance matching element mentioned above. In some embodiments, the magnetic field oscillates at microwave frequency to excite spin resonance of a single electron (dopant), i.e., electron spin resonance (ESR).

The magnetic field may be strong to allow fast oscillation of spin states. Meanwhile, the absence of electric field in the tunnel barrier region is desired to guarantee the proper operation of electronic devices. Specifically, the electric fields may lead to some effects, such as photon-assisted tunneling, disrupt the operation of the electronic device, and contribute to local heating of the electronic device. The embodiments of the present disclosure solve issues in existing approaches by providing the ring resonator R having strong magnetic fields and weak or negligible electric fields at the tunnel barrier 116.

In greater detail, when a current flows in the ring resonator R in FIG. 12A, strong magnetic fields and weak or negligible electric fields can be obtained in the accommodating space S of the conductive loop 190. Therefore, when the tunnel barrier 116 overlaps with the accommodating space S, the strong magnetic fields and weak or negligible electric fields generated by the ring resonator R is applied to the single dopant (i.e., a quantum dot) implanted in the active region 114, and the efficiency of the qubit can be approved.

Figure 14A:
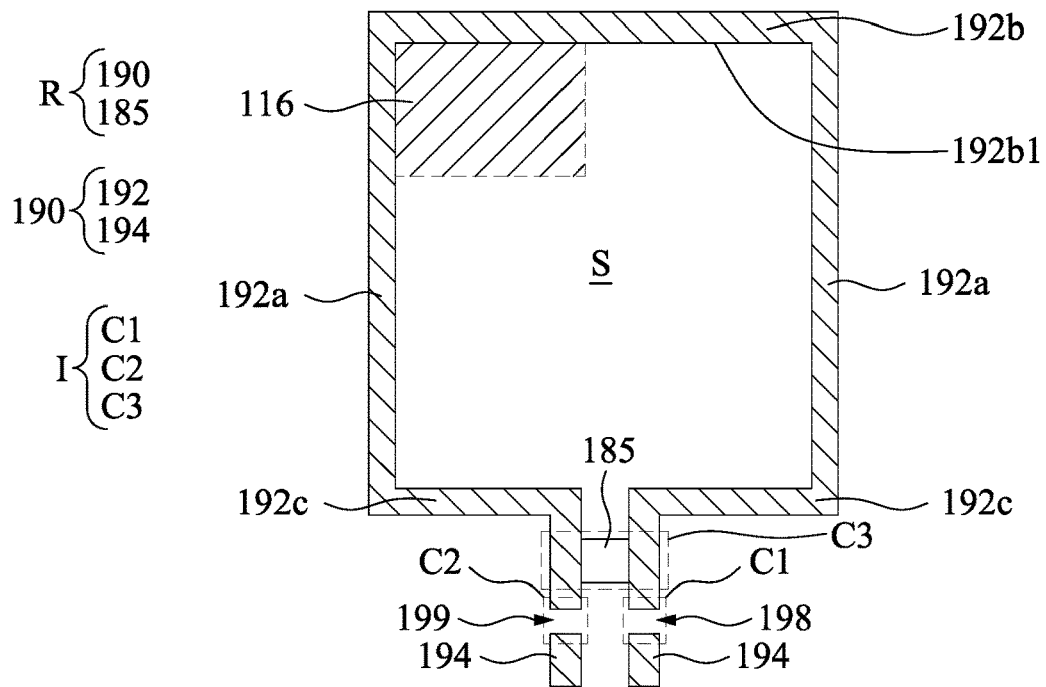
FIG. 14A is a top view of the ring resonator and the tunnel barrier in FIG. 12A.

FIG. 14A is a top view of the ring resonator R and the tunnel barrier 116 in FIG. 12A. In FIG. 14A, the loop portion 192 of the conductive loop 190 forms a rectangular loop. That is, the accommodating space S is rectangular. The loop portion 192 includes two first parts 192a, a second part 192b, and two third parts 192c. Each of the first parts 192a interconnects the second part 192b and one of the third parts 192c, and the third parts 192c respectively form the capacitors C1 and C2 with the feeding lines 194. In FIG. 14A, the first part 192a is longer than the second part 192b. In some embodiments, the tunnel barrier 116 overlaps with an inner edge 192b1 of the second part 192b. That is, the tunnel barrier 116 is spaced apart from the feeding lines 194. In some embodiments, the tunnel barrier 116 overlaps with a corner of the accommodating space S away from the third parts 192c of the loop portion 192. In some other embodiments, the tunnel barrier 116 overlaps with the inner edge 192b1 of the second part 192b but spaced apart from the first parts 192a. With such configurations, the tunnel barrier 116 is spaced apart from the electric field formed in the feeding lines 194.

Figure 14B:
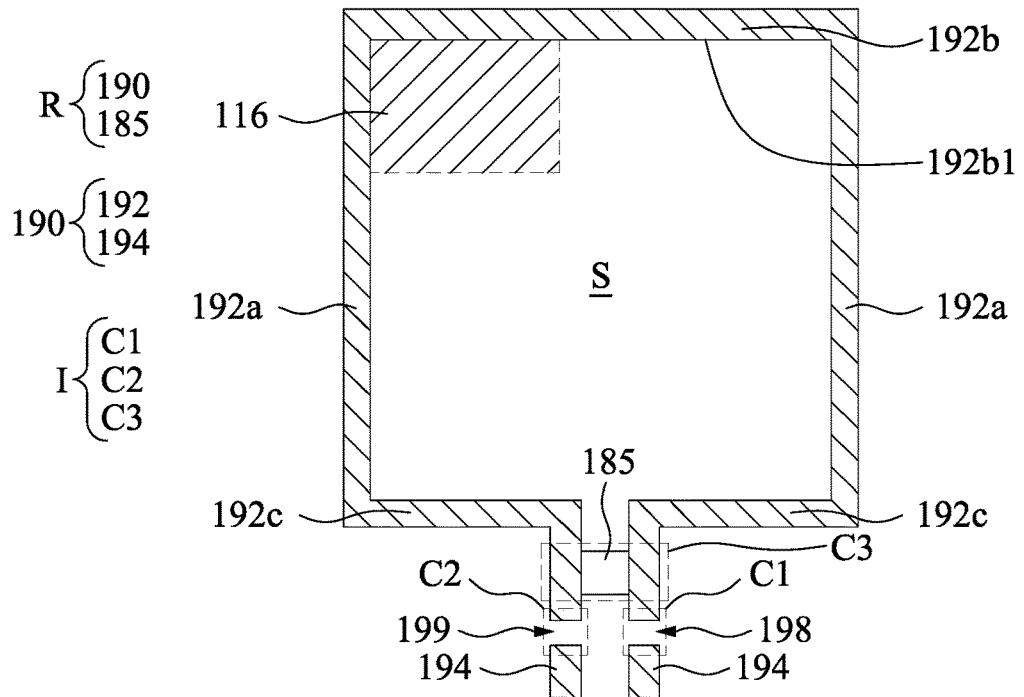
FIGS. 14B-14F are top views of the ring resonator and the tunnel barrier according to some embodiments.

FIGS. 14B-14F are top views of the ring resonator R and the tunnel barrier 116 according to some embodiments. In FIG. 14B, the loop portion 192 of the conductive loop 190 forms a square loop. That is, the accommodating space S is square. The first part 192a has a length substantially the same as the second part 192b. In some embodiments, the tunnel barrier 116 overlaps with an inner edge 192b1 of the second part 192b. That is, the tunnel barrier 116 is spaced apart from the feeding lines 194. In some embodiments, the tunnel barrier 116 overlaps with a corner of the accommodating space S away from the third parts 192c of the loop portion 192. In some other embodiments, the tunnel barrier 116 overlaps with the inner edge 192b1 of the second part 192b but spaced apart from the first parts 192a. With such configurations, the tunnel barrier 116 is spaced apart from the electric field formed in the feeding lines 194.

Figure 14C:
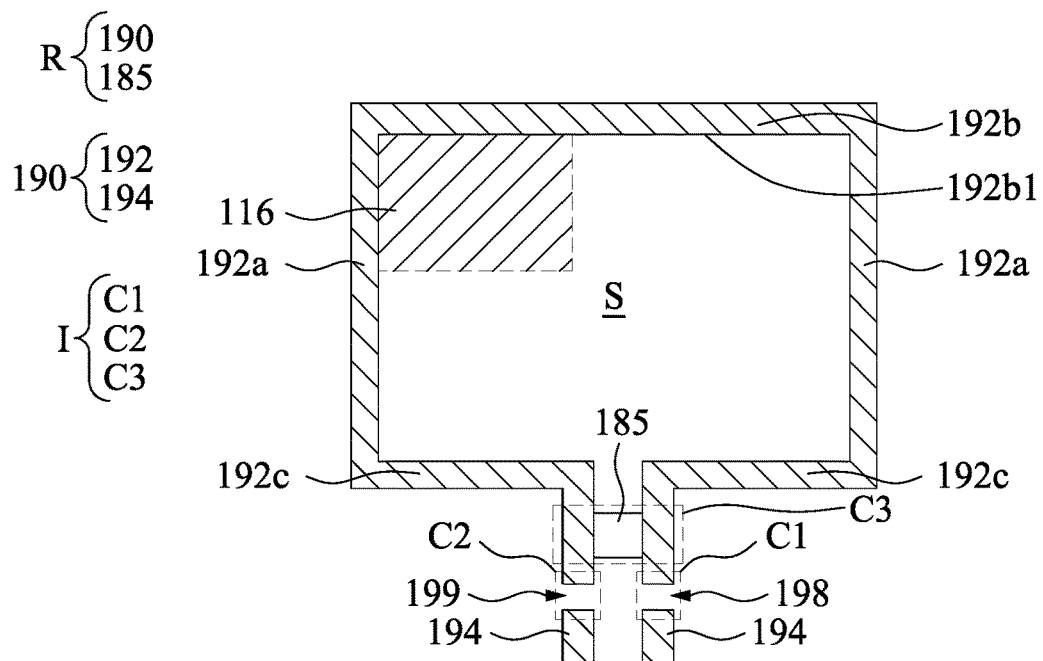

In FIG. 14C, the loop portion 192 of the conductive loop 190 forms a rectangular loop. That is, the accommodating space S is rectangular. The first part 192a is shorter than the second part 192b. In some embodiments, the tunnel barrier 116 overlaps with an inner edge 192b1 of the second part 192b. That is, the tunnel barrier 116 is spaced apart from the feeding lines 194. In some embodiments, the tunnel barrier 116 overlaps with a corner of the accommodating space S away from the third parts 192c of the loop portion 192. In some other embodiments, the tunnel barrier 116 overlaps with the inner edge 192b1 of the second part 192b but spaced apart from the first parts 192a. With such configurations, the tunnel barrier 116 is spaced apart from the electric field formed in the feeding lines 194.

Figure 14D:
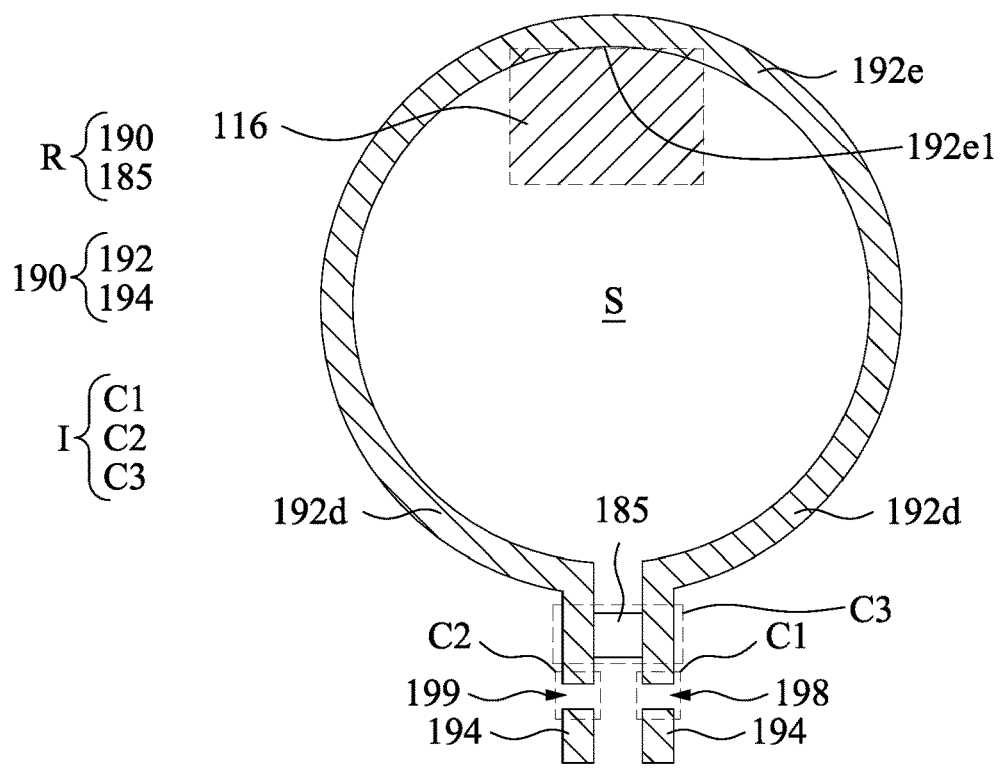

In FIG. 14D, the loop portion 192 of the conductive loop 190 forms a circular loop. That is, the accommodating space S is circular. The loop portion 192 includes two first parts 192d and a second part 192e interconnecting the two first parts 192d. The second part 192e is spaced apart from the feeding lines 194, and the first parts 192d respectively form the capacitors C1 and C2 with the feeding lines 194. In some embodiments, the second part 192e is a semicircular ring, and the first parts 192d have substantially the same shape. In some embodiments, the tunnel barrier 116 overlaps with an inner edge 192e1 of the second part 192e. That is, the tunnel barrier 116 is spaced apart from the feeding lines 194. With such configurations, the tunnel barrier 116 is spaced apart from the electric field formed in the feeding lines 194.

Figure 14E:
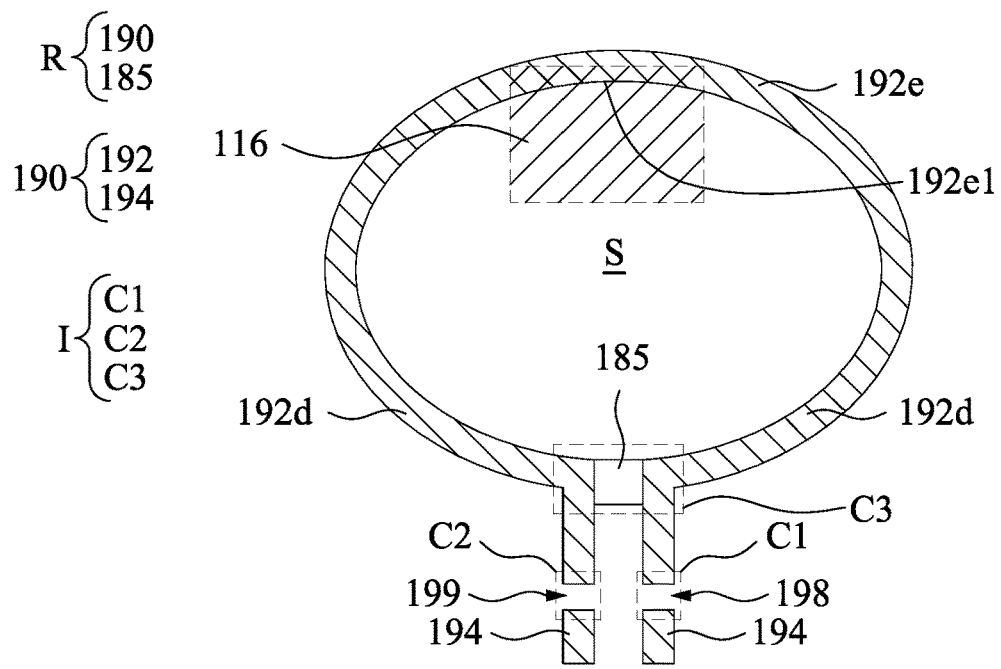
Figure 14F:
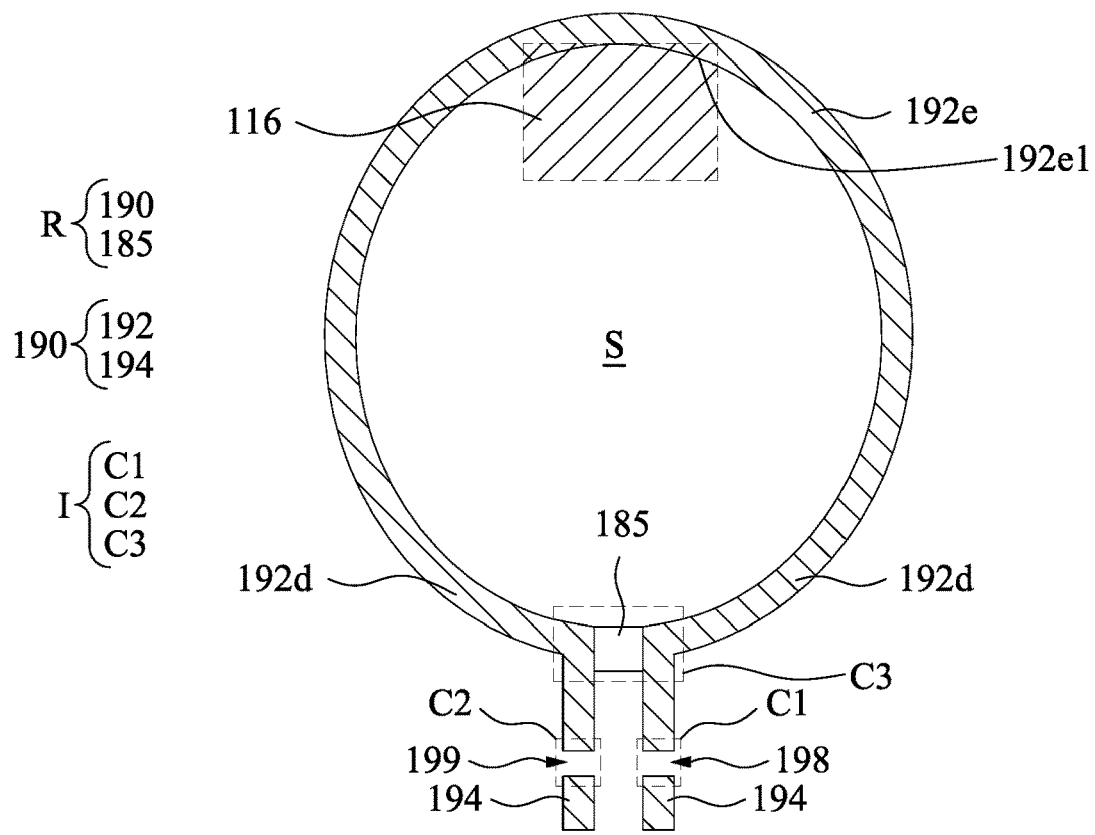

In FIGS. 14E and 14F, the loop portion 192 of the conductive loop 190 forms an oval loop. That is, the accommodating space S is oval. The loop portion 192 includes two first parts 192d and a second part 192e interconnecting the first parts 192d. The second part 192e is spaced apart from the feeding lines 194, and the first parts 192d respectively form the capacitors C1 and C2 with the feeding lines 194. In some embodiments, the second part 192e is a semioval ring, and the first parts 192d have substantially the same shape. In some embodiments, the tunnel barrier 116 overlaps with an inner edge 192e1 of the second part 192e. That is, the tunnel barrier 116 is spaced apart from the feeding lines 194. With such configurations, the tunnel barrier 116 is spaced apart from the electric field formed in the feeding lines 194.

Figure 15:
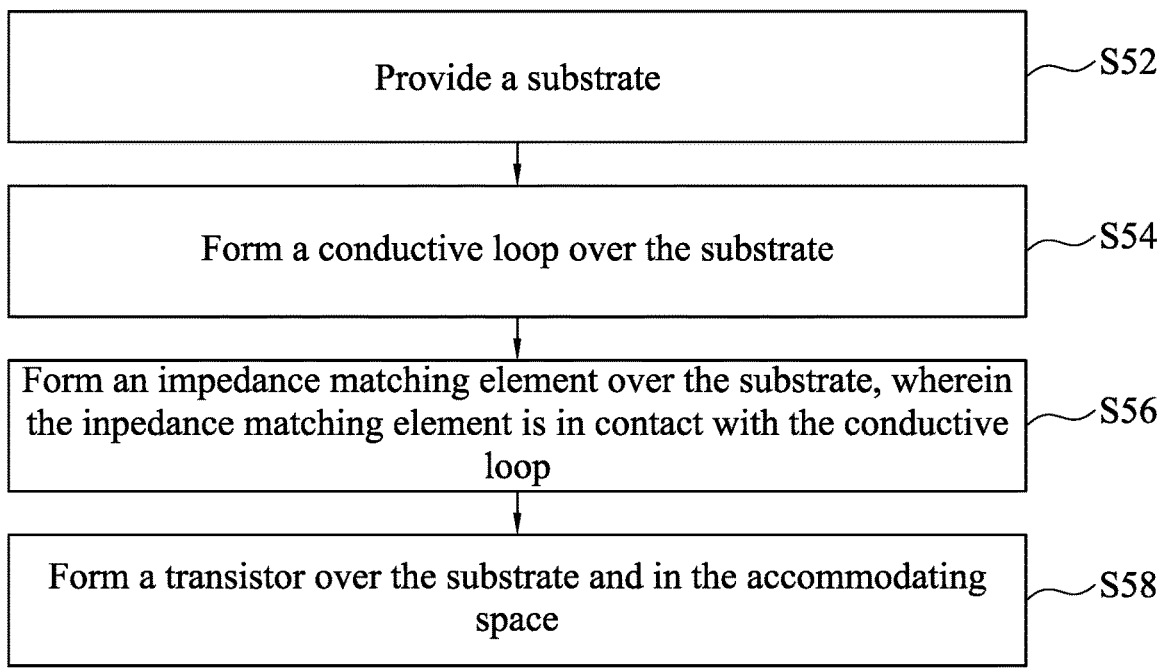
FIG. 15 is a flowchart of a method M50 for making an electronic device according to some aspects of the present disclosure in various embodiments.
Figure 16:
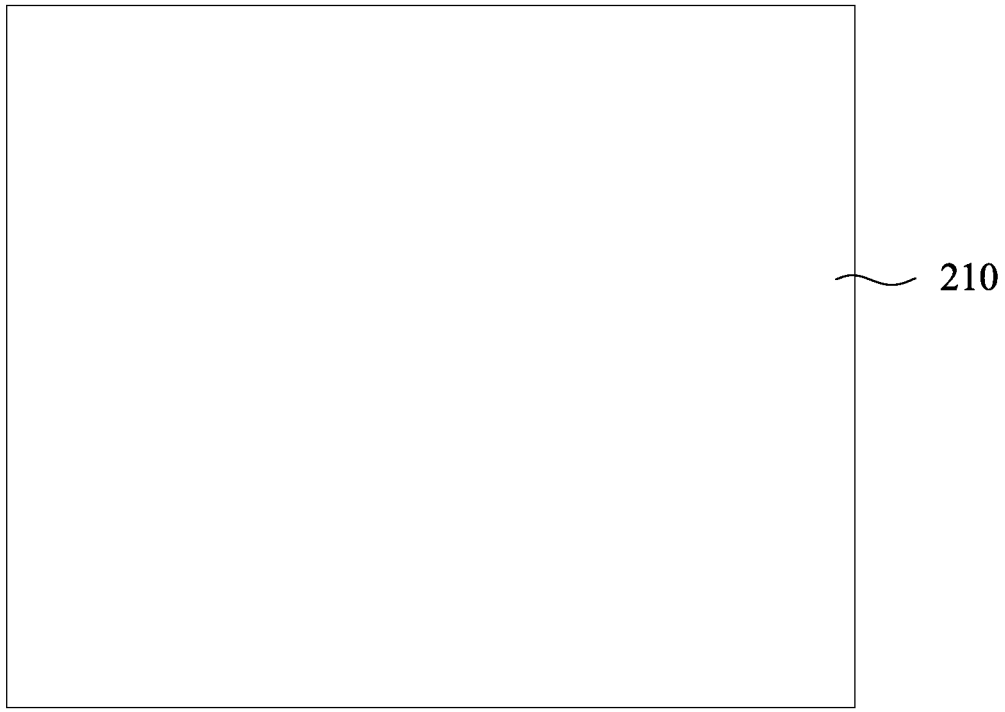
FIGS. 16 to 19 illustrate a method in various stages of fabricating an electronic device in accordance with some embodiments of the present disclosure.

FIG. 15 is a flowchart of a method M50 for making an electronic device according to some aspects of the present disclosure in various embodiments. Various operations of the method M50 are discussed in association with cross-section diagrams FIGS. 16-19. Throughout the various views and illustrative embodiments, like reference numbers are used to designate like elements. In operation S52 of method M50, a substrate 210 is provided, as shown in FIG. 16, which is a top view of the electronic device according to some embodiments. In some embodiments, the substrate 210 may have the same material as the substrate 110 shown in FIG. 2A. In some other embodiments, the substrate 210 may be a plate circuit board (PCB).

Figure 17A:
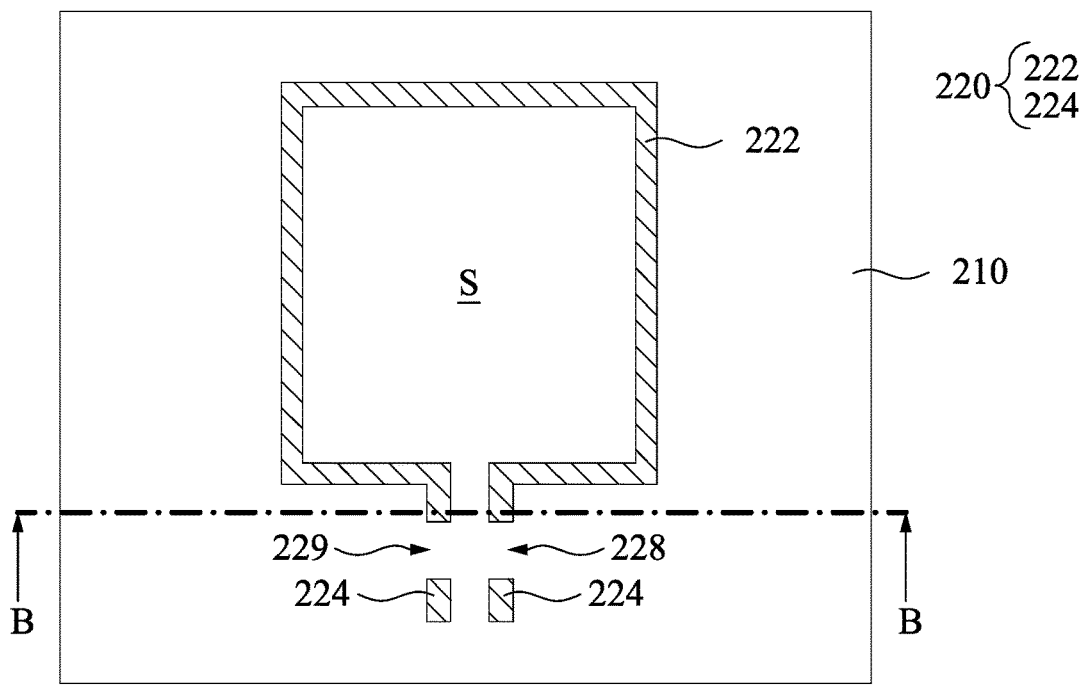
Figure 17B:
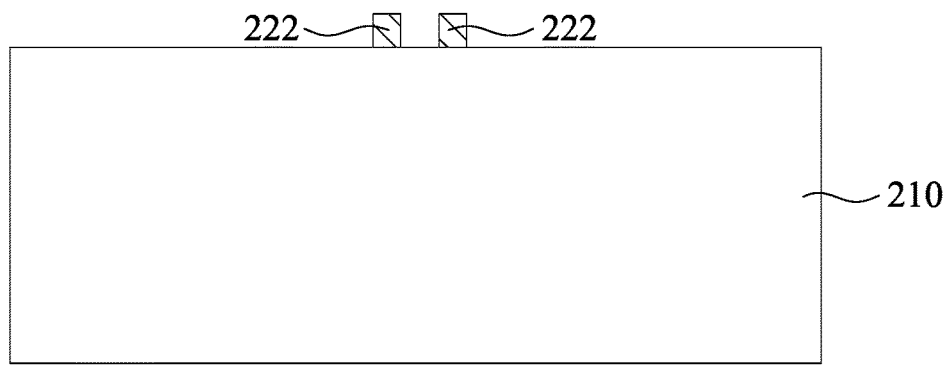

In operation S54 of method M50, a conductive loop 220 is formed over the substrate 210, as shown in FIGS. 17A and 17B, where FIG. 17B is a cross-sectional view taken along B-B of FIG. 17A. For example, a conductive material is formed over the substrate 210, and the conductive material is patterned to form the conductive loop 220 using a combination of photolithography and etching process. In some embodiments, the conductive loop 220 includes one or more layers of conductive material. Examples of the conductive loop 220 include W, Ti, TiAlC, Al, TiAl, TaN, TaAlC, TiN, TiC, Co, TaC, Al, TiAl, HfTi, TiSi, TaSi, TiAlC, combinations thereof, or the like. The conductive loop 220 may be formed by chemical vapor deposition (CVD), physical vapor deposition (PVD) including sputtering, atomic layer deposition (ALD) or other suitable method.

In FIG. 17A, the conductive loop 220 includes a loop portion 222 and two feeding lines 224. The loop portion 222 forms an accommodating space S. A gap 228 is formed between an end of the loop portion 222 and one of the feeding lines 224, and another gap 229 is formed between another end of the loop portion 222 and another of the feeding lines 224. In some embodiments, the gaps 228 and 229 have substantially the same distance, such that the electric fields respectively formed in the feeding lines 224 may be cancelled out.

Figure 18:
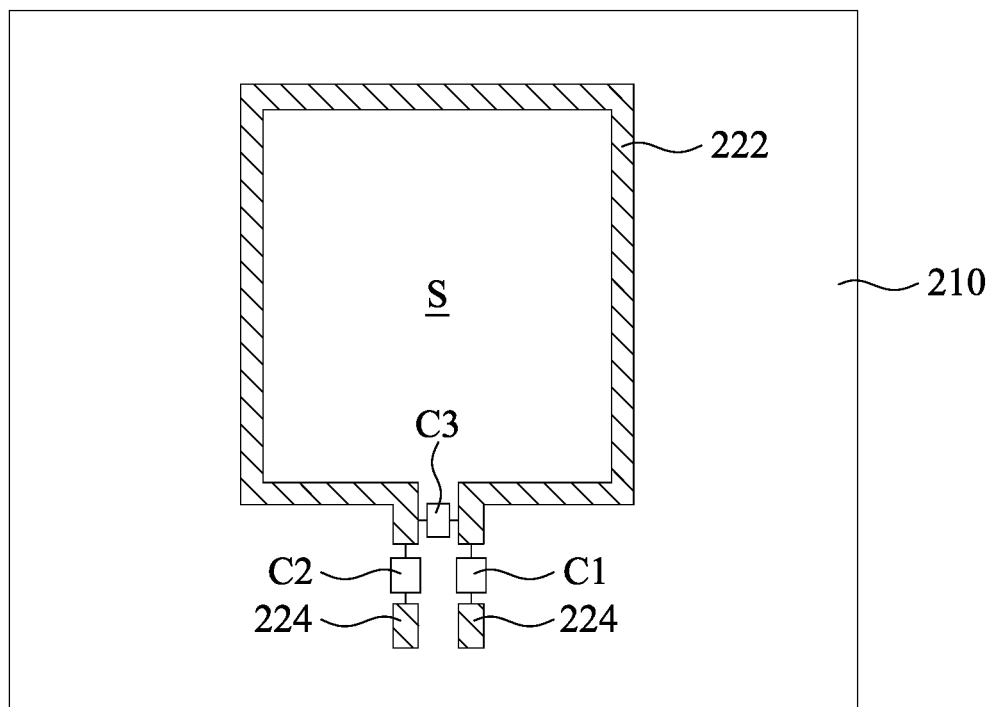

In operation S56 of method M50, an impedance matching element I is formed over the substrate 220, wherein the impedance matching element I is in contact with the conductive loop 220, as shown in FIG. 18. In some embodiments, the impedance matching element I includes a first matching element C1, a second matching element C2, and a third matching element C3. The first matching element C1, the second matching element C2, and the third matching element C3 may be bond to the conductive loop 220. The first matching element C1 is disposed in the gap 228 (see FIG. 17A) and interconnects the loop portion 222 and one of the feeding lines 224, the second matching element C2 is disposed in the gap 229 (see FIG. 17A) and interconnects the loop portion 222 and another of the feeding lines 224, and the third matching element C3 is disposed between the feeding lines 224 and interconnects the feeding lines 224. In some embodiments, the matching elements C1, C2, and C3 are capacitances. The matching elements C1 and C2 are series capacitors, and the third capacitor C3 is a parallel capacitor. The capacitances of the capacitors C1, C2, and C3 depend on the desired resonance frequency of the qubit of the electronic device. In some embodiments, the capacitors C1 and C2 have substantially the same capacitance, such that the current flows in the feeding lines 224 may be substantially the same but in opposite directions. In some other embodiments, the matching elements C1, C2, and C3 are inductors. The matching elements C1 and C2 are series inductors, and the third inductor C3 is a parallel inductor. The inductances of the inductors C1, C2, and C3 depend on the desired resonance frequency of the qubit of the electronic device. In some embodiments, the inductors C1 and C2 have substantially the same inductance, such that the current flows in the feeding lines 224 may be substantially the same but in opposite directions. In still some other embodiments, the matching elements C1 and C2 are inductors and the matching elements C3 is a capacitor. Alternatively, the matching elements C1 and C2 are capacitors and the matching elements C3 is an inductor.

In FIG. 18, the conductive loop 220 and the impedance matching element I form a ring resonator R. The impedance matching element I is configured to determine the resonance frequency of the ring resonator R. In some embodiments, the impedance matching element I includes the matching elements C1, C2, and C3; in some other embodiments, however, the impedance matching element I includes the matching elements C1 and C2 or only includes the matching element C3.

Figure 19:
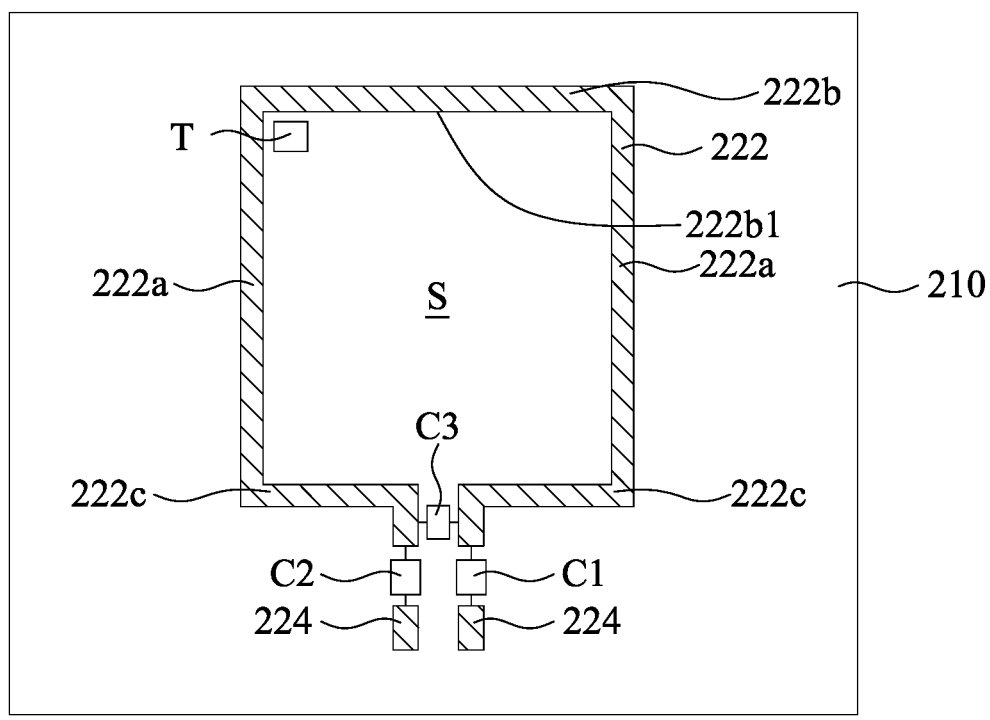

In operation S58 of method M50, a transistor T is formed over the substrate 210 and in the accommodating space S, as shown in FIG. 19. In some embodiments, the transistor T may be bond to the substrate 210. The transistor T may have the same or similar configurations as the transistor T shown in FIGS. 9A and 9B, such that the transistor T is configured to produce a single charge (quantum dot) at a time. In some embodiments, the operations S56 and S58 may be performed together. That is, the impedance matching element I and the transistor T may be bond to the substrate 210 in the same process. In some other embodiments, the operations S56 may be performed after the operation S58.

In FIG. 19, the loop portion 222 of the conductive loop 220 forms a rectangular loop. That is, the accommodating space S is rectangular. The loop portion 222 includes two first parts 222a, a second part 222b, and two third parts 222c. Each of the first parts 222a interconnects the second part 222b and one of the third parts 222c, and the third parts 222c respectively connect to the matching elements C1 and C2. In FIG. 19, the first part 222a is longer than the second part 222b. In some embodiments, (the tunnel barrier of) the transistor T is adjacent to an inner edge 222b1 of the second part 222b. That is, the transistor T is spaced apart from the feeding lines 224. In some embodiments, the transistor T overlaps with a corner of the accommodating space S away from the third parts 222c of the loop portion 222. In some other embodiments, the transistor T overlaps with the inner edge 222b1 of the second part 222b but spaced apart from the first parts 222a. With such configurations, the tunnel barrier 226 is spaced apart from the electric field formed in the feeding lines 224.

The electronic device may implement a qubit with high efficiency. In some embodiments, the substrate was a ceramic-filled PTFE composite/laminate (e.g., Rogers RO3010). The thickness of the substrate was about 640 um. The loop had a size about 70 um by about 130 um. The line width of the conductive loop was about 10 um. The thickness of the conductive loop was about 1 um. The conductive loop was made of copper. The distance between the feeding lines was about 15 um. The reflection coefficients ($|S_{11}|$) were below about −6 dB. The resulting resonating frequency was about 30 GHz. The amplitude of the microwave magnetic field generated by the aforementioned electronic device was greater than about 10 mT at about 30 GHz with 0 dBm input power, which is sufficiently acceptable for spin-based qubit control. Also, the sufficient microwave magnetic field contributes to the absence of the input power, which may raise the electric field. The frequency response of magnitude ratio of z-polarized magnetic field (mT) to total electric field (MV/m) was greater than about 1650 mT*m/MV. In some other embodiments, the frequency response of magnitude ratio of z-polarized magnetic field to total electric field was greater than about 10000 mT*m/MV. For the embodiments having a frequency response greater than about 10000 mT*m/MV, the input power may be further increased to increase the magnetic field while the total electric field is not significantly increased.

Figure 20:
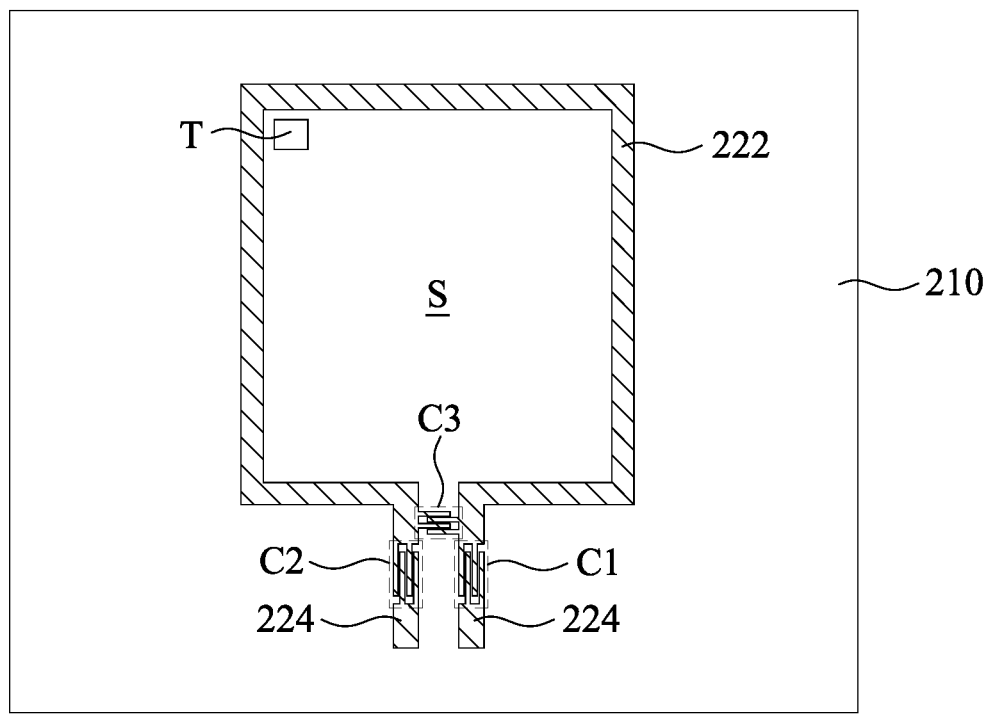
FIG. 20 is a top view of an electronic device according to some embodiments of the present disclosure.

FIG. 20 is a top view of an electronic device according to some embodiments of the present disclosure. The difference between the electronic devices of FIGS. 20 and 19 pertains to the configurations of the matching elements C1, C2, and C3. In FIG. 20, the matching elements C1, C2, and C3 are interdigitated capacitors. Each of the matching elements C1, C2, and C3 has a plurality of fingers extend toward the opposite electrode of the capacitor. The finger configuration is benefit for increasing the capacitance thereof within a small layout area. The interdigitated capacitors may be formed during the operation S54 (see FIG. 15). The operation S56 in FIG. 15 may be omitted if the matching elements C1, C2, and C3 are interdigitated capacitors. In some other embodiments, some of the matching elements C1, C2, and C3 is/are interdigitated capacitor(s), and the rest of the matching elements C1, C2, and C3 is/are bonded capacitor(s). Other relevant structural details of the electronic device in FIG. 20 are similar to the electronic device in FIG. 19, and, therefore, a description in this regard will not be repeated hereinafter.

Figure 21A:
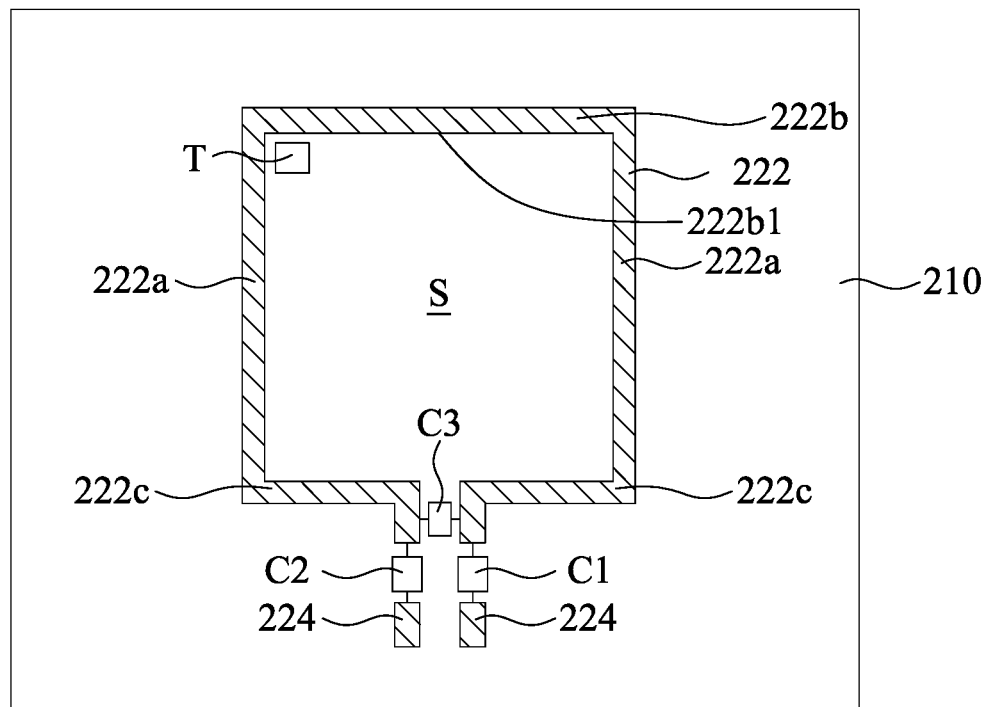
FIGS. 21A-21E are top views of the electronic devices according to some embodiments.

FIGS. 21A-21E are top views of the electronic devices according to some embodiments. In FIG. 21A, the loop portion 222 of the conductive loop 220 forms a square loop. That is, the accommodating space S is square. The first part 222a has a length substantially the same as the second part 222b. In some embodiments, the transistor T (also the tunnel barrier thereof) is adjacent to an inner edge 222b1 of the second part 222b. That is, the transistor T is spaced apart from the feeding lines 224. In some embodiments, the transistor T overlaps with a corner of the accommodating space S away from the third parts 222c of the loop portion 222. In some other embodiments, the transistor T is adjacent to the inner edge 222b1 of the second part 222b but spaced apart from the first parts 222a. With such configurations, the transistor T is spaced apart from the electric field formed in the feeding lines 224.

Figure 21B:
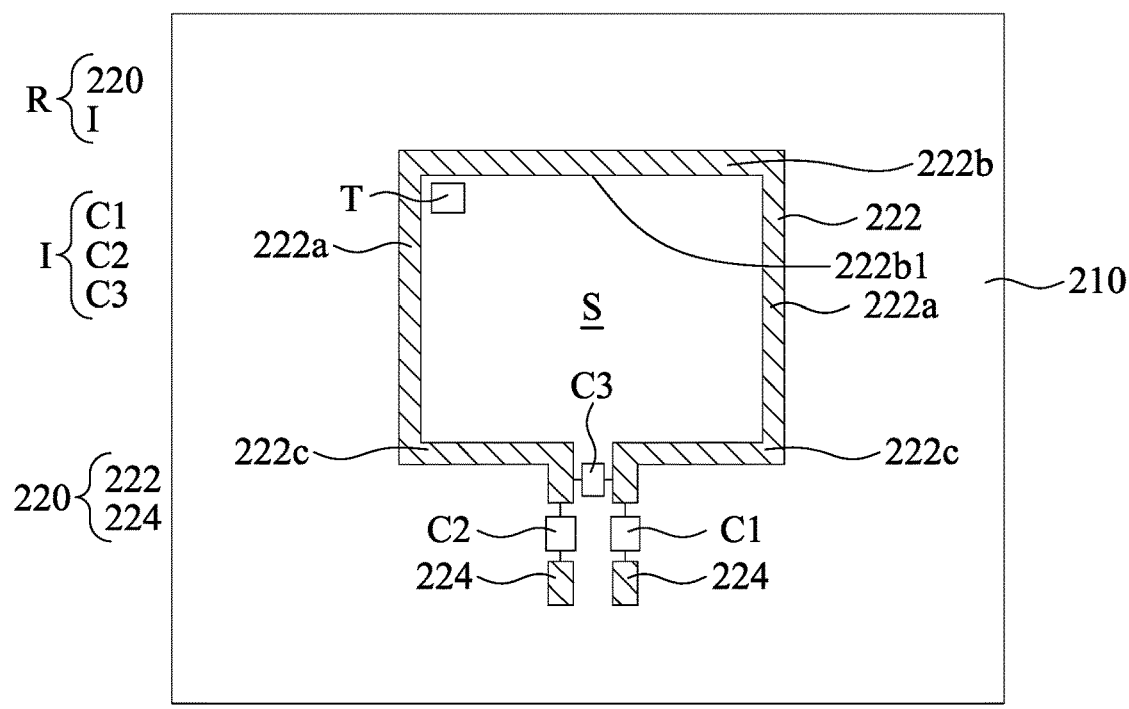

In FIG. 21B, the loop portion 222 of the conductive loop 220 forms a rectangular loop. That is, the accommodating space S is rectangular. The first part 222a is shorter than the second part 222b. In some embodiments, the transistor T (and the tunnel barrier thereof) is adjacent to an inner edge 222b1 of the second part 222b. That is, the transistor T is spaced apart from the feeding lines 224. In some embodiments, the transistor T overlaps with a corner of the accommodating space S away from the third parts 222c of the loop portion 222. In some other embodiments, the transistor T is adjacent to the inner edge 222b1 of the second part 222b but spaced apart from the first parts 222a. With such configurations, the transistor T is spaced apart from the electric field formed in the feeding lines 224.

Figure 21C:
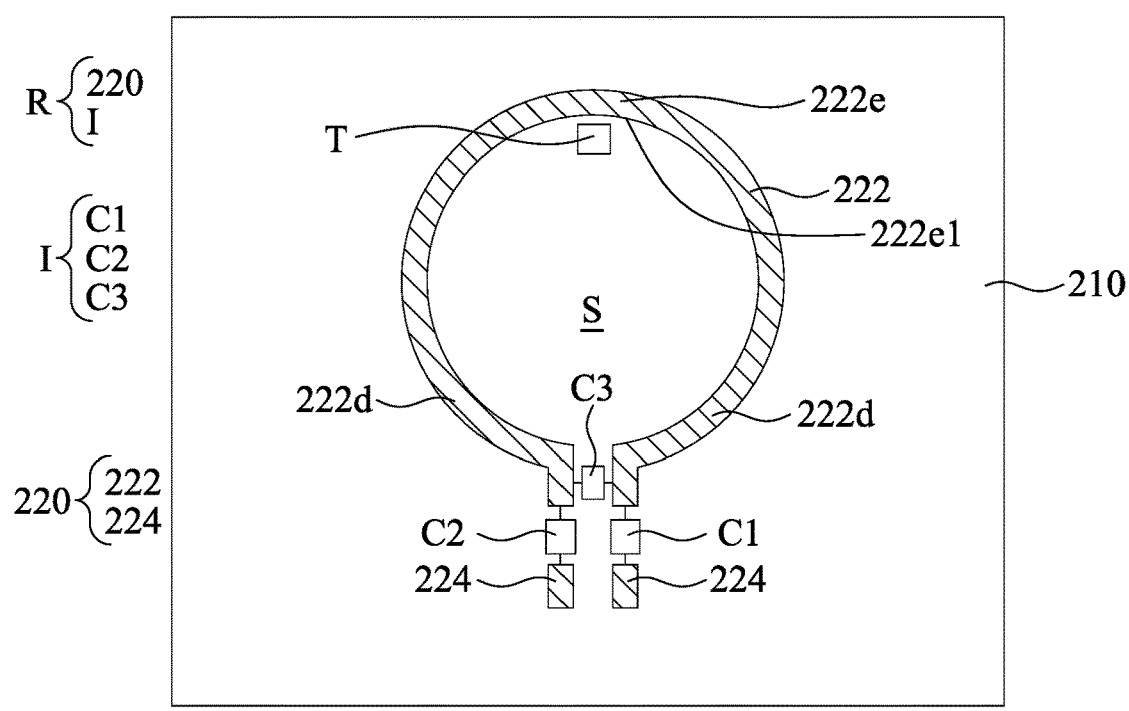

In FIG. 21C, the loop portion 222 of the conductive loop 220 forms a circular loop. That is, the accommodating space S is circular. The loop portion 222 includes two first parts 222d and a second part 222e interconnecting the two first parts 222d. The second part 222e is spaced apart from the feeding lines 224, and the first parts 222d respectively connect to the matching elements C1 and C2. In some embodiments, the second part 222e is a semi-circular ring, and the first parts 222d have substantially the same shape. In some embodiments, the transistor T is adjacent to an inner edge 222e1 of the second part 222e. That is, the transistor T is spaced apart from the feeding lines 224. With such configurations, the transistor T is spaced apart from the electric field formed in the feeding lines 224.

Figure 21D:
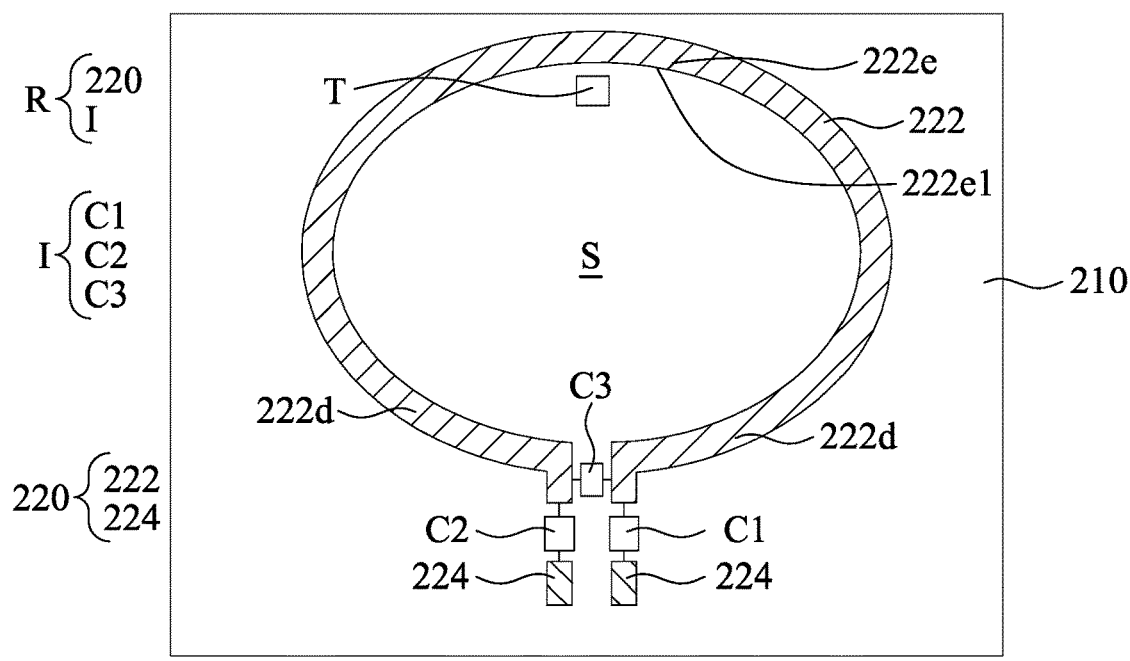
Figure 21E:
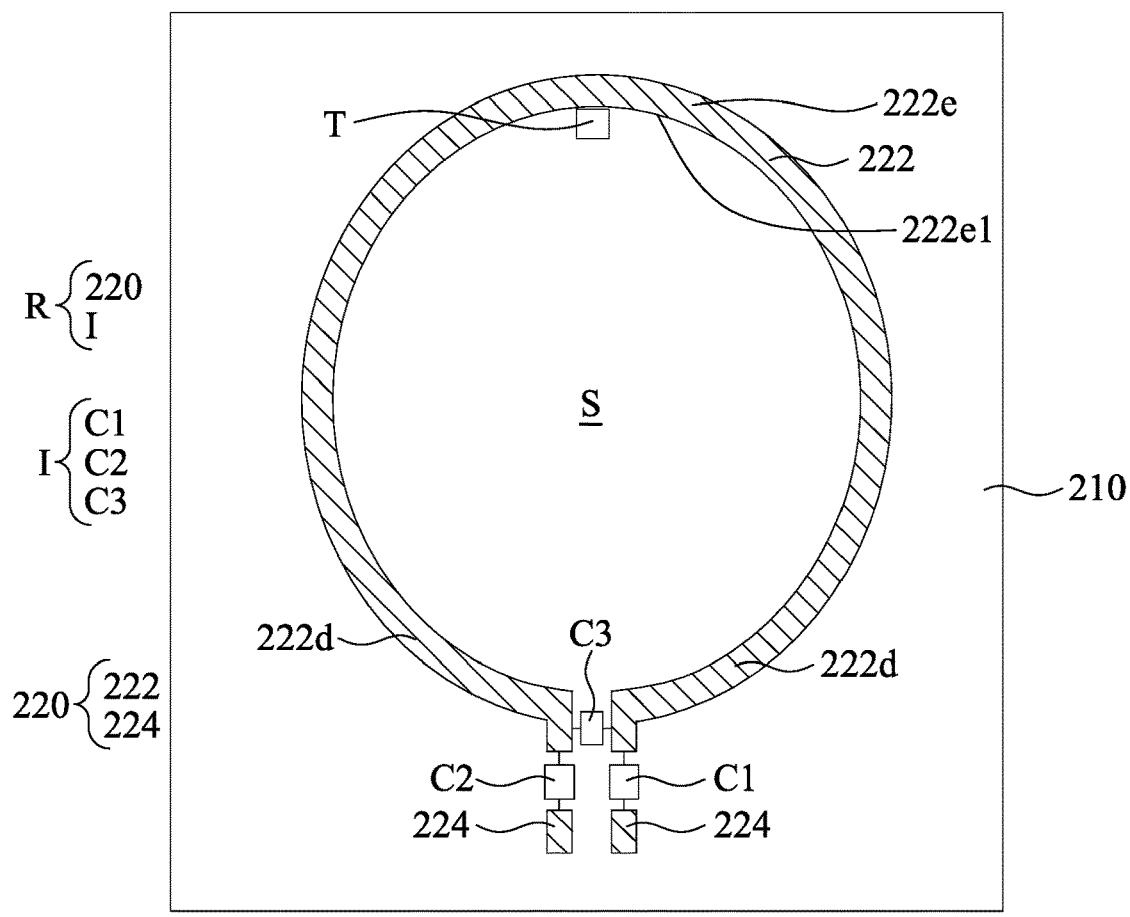

In FIGS. 21D and 21E, the loop portion 222 of the conductive loop 220 forms an oval loop. That is, the accommodating space S is oval. The loop portion 222 includes two first parts 222d and a second part 222e interconnecting the first parts 222d. The second part 222e is spaced apart from the feeding lines 224, and the first parts 222d respectively connect to the matching elements C1 and C2. In some embodiments, the second part 222e is a semi-oval ring, and the first parts 222d have substantially the same shape. In some embodiments, the transistor T is adjacent to an inner edge 222e1 of the second part 222e. That is, the transistor T is spaced apart from the feeding lines 224. With such configurations, the transistor T is spaced apart from the electric field formed in the feeding lines 224.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the ring resonator is able to generate strong magnetic fields and weak or negligible electric fields on the transistor, such that the qubit generated in the transistor has a high efficiency. Furthermore, the ring resonator has a simple structure and may be integrated for an IC design and a PCB design. Moreover, the resonance frequency can be tuned by the impedance matching element, such that the qubit can be applied in a wide range of frequency.

According to some embodiments, an electronic device includes a substrate, a transistor, and a ring resonator. The transistor is over the substrate. The transistor is configured to generate a quantum dot. The ring resonator is over the substrate and includes a conductive loop and an impedance matching element. The conductive loop overlaps with the transistor. The impedance matching element is on the conductive loop and is configured to determine a resonance frequency of the ring resonator.

According to some embodiments, an electronic device includes a substrate, a transistor, and a ring resonator. The transistor is over the substrate. The ring resonator is over the substrate and overlaps with the transistor. The ring resonator includes a conductive loop and an impedance matching element. The conductive loop includes a loop portion and two feeding lines. The loop portion has two first parts and a second part. Each of the first parts of the loop portion interconnects the second part of the loop portion and one of the feeding lines, and a tunnel barrier of the transistor is closer to the second part than the feeding lines. The impedance matching element is closer to the feeding lines than the second part.

According to some embodiments, a method for manufacturing an electronic device includes forming a transistor over a substrate. The transistor is configured to generate a quantum dot. A conductive loop is over the substrate, such that the conductive loop overlaps with the transistor. An impedance matching element is formed over the substrate and on the conductive loop.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electronic device comprising:
   a substrate;
   a transistor over the substrate, wherein the transistor has a tunnel barrier in the substrate; and
   a ring resonator over the substrate, wherein the ring resonator comprises:
      a conductive loop above the transistor, wherein in a top view the conductive loop forms a ring-shaped pattern surrounding an entirety of the tunnel barrier; and
      an impedance matching element on the conductive loop, wherein conductive portions of the impedance matching element are electrically isolated from the transistor.

2. The electronic device of claim 1, wherein the conductive loop comprises:
   a loop portion defining an accommodating space therein; and
   two feeding lines respectively spaced apart from the loop portion.

3. The electronic device of claim 2, wherein the impedance matching element comprises a first capacitor and a second capacitor, wherein the first capacitor comprises a first end part of the loop portion and a part of one of the feeding lines, and the second capacitor comprises a second end part of the loop portion and a part of another one of the feeding lines.

4. The electronic device of claim 3, wherein the first capacitor and the second capacitor have substantially the same capacitance.

5. The electronic device of claim 3, wherein the first capacitor is an interdigitated capacitor.

6. The electronic device of claim 2, wherein the impedance matching element further comprises a matching material in contact with the conductive loop, such that the matching material and the conductive loop define a third capacitor of the impedance matching element.

7. The electronic device of claim 2, wherein the impedance matching element comprises a first matching element interconnecting one end of the loop portion and one of the feeding lines and a second matching element interconnecting one end of the loop portion and another one of the feeding lines.

8. The electronic device of claim 7, wherein the first matching element and the second matching element are capacitors, inductors, or combinations thereof.

9. The electronic device of claim 2, wherein the impedance matching element further comprises a third matching element interconnecting the feeding lines.

10. An electronic device comprising:
    a substrate;
    a transistor over the substrate and comprising:
       a pair of depletion gates over the substrate, wherein the pair of depletion gates defines a tunnel barrier in the substrate; and
       an accommodating gate over the pair of depletion gates; and
    a ring resonator over the accommodating gate and comprising:
       a conductive loop surrounding the transistor in a top view, wherein the conductive loop forms an accommodating space overlapping with an entirety of the tunnel barrier, and wherein the conductive loop is above and separated from the accommodating gate in a cross-sectional view; and
       an impedance matching element electrically isolated from the transistor, wherein an electrode of the impedance matching element is in direct contact with the conductive loop.

11. The electronic device of claim 10, wherein in the top view, the impedance matching element is outside a region surrounded by the conductive loop.

12. The electronic device of claim 10, wherein the conductive loop of the ring resonator comprises:
    a loop portion surrounding the transistor in the top view;
    a first feeding line at a first end part of the loop portion; and
    a second feeding line at a second end part of the loop portion.

13. The electronic device of claim 12, wherein the impedance matching element comprises:
    a first matching element between the first end part of the loop portion and the first feeding line; and
    a second matching element between the second end part of the loop portion and the second feeding line.

14. An electronic device comprising:
    a substrate;
    a transistor over the substrate, wherein the transistor has a tunnel barrier in the substrate; and
    a ring resonator over the transistor and comprising:
       a loop portion having a ring-shaped pattern surrounding the transistor in a top view, wherein the tunnel barrier overlaps with a first edge of the loop portion and spaced apart from a second edge of the loop portion in the top view;
       a first feeding line spaced apart from the loop portion;
       a second feeding line spaced apart from the loop portion;

a first matching element interconnecting the loop portion and the first feeding line; and a second matching element interconnecting the loop portion and the second feeding line, wherein the first matching element and the second matching element are electrically isolated from the transistor, and wherein in the top view the first matching element and the second matching element do not overlap with the tunnel barrier.

15. The electronic device of claim 14, wherein the transistor comprises a pair of depletion gates having an extension direction substantially the same as an extension direction of the first matching element in the top view.

16. The electronic device of claim 14, wherein the transistor comprises an accommodating gate having an extension direction substantially perpendicular to an extension direction of the first matching element in the top view.

17. The electronic device of claim 14, wherein the transistor comprises an accommodating gate over the substrate, and the accommodating gate does not overlap with the first matching element in the top view.

18. The electronic device of claim 1, wherein the conductive portions of the impedance matching element are electrically connected to the conductive loop.

19. The electronic device of claim 10, wherein the electrode of the impedance matching element is electrically isolated from the transistor.

20. The electronic device of claim 14, wherein the loop portion is an open loop in the top view.

* * * * *